(12) United States Patent
Mori et al.

(10) Patent No.: US 8,304,915 B2
(45) Date of Patent: Nov. 6, 2012

(54) SEMICONDUCTOR DEVICE AND METHOD FOR MANUFACTURING THE SAME

(75) Inventors: Kentaro Mori, Tokyo (JP); Hideya Murai, Tokyo (JP); Shintaro Yamamichi, Tokyo (JP); Masaya Kawano, Kanagawa (JP); Koji Soejima, Kanagawa (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 81 days.

(21) Appl. No.: 13/055,372

(22) PCT Filed: Jul. 23, 2009

(86) PCT No.: PCT/JP2009/063156
§ 371 (c)(1),
(2), (4) Date: Jan. 21, 2011

(87) PCT Pub. No.: WO2010/010911
PCT Pub. Date: Jan. 28, 2010

(65) Prior Publication Data
US 2011/0121445 A1    May 26, 2011

(30) Foreign Application Priority Data
Jul. 23, 2008    (JP) ................. 2008-190100

(51) Int. Cl.
*H01L 23/48* (2006.01)
*H01L 23/52* (2006.01)
*H01L 29/40* (2006.01)

(52) U.S. Cl. ......... 257/774; 257/778; 257/775; 438/108
(58) Field of Classification Search ............... 257/778, 257/773, 774, 775, 698; 438/108, 125
See application file for complete search history.

(56) References Cited

U.S. PATENT DOCUMENTS

| | | | |
|---|---|---|---|
| 6,815,713 B2 * | 11/2004 | Lu et al. | 257/48 |
| 7,372,151 B1 * | 5/2008 | Fan et al. | 257/738 |
| 7,985,671 B2 * | 7/2011 | Daubenspeck et al. | 438/597 |
| 2007/0178686 A1 | 8/2007 | Honda | |
| 2007/0289127 A1 * | 12/2007 | Hurwitz et al. | 29/827 |
| 2009/0017613 A1 | 1/2009 | Honda | |
| 2009/0129037 A1 | 5/2009 | Yoshino | |
| 2010/0127360 A1 * | 5/2010 | Pagaila et al. | 257/659 |
| 2012/0018876 A1 * | 1/2012 | Wu et al. | 257/737 |

FOREIGN PATENT DOCUMENTS

| | | |
|---|---|---|
| JP | 2001-217514 A | 8/2001 |
| JP | 2001-339165 A | 12/2001 |
| JP | 2002-246722 A | 8/2002 |
| JP | 2004-288711 A | 10/2004 |
| JP | 2005-072328 A | 3/2005 |
| JP | 2007-207872 A | 8/2007 |
| JP | 2007-214535 A | 8/2007 |

* cited by examiner

*Primary Examiner* — S. V Clark
(74) *Attorney, Agent, or Firm* — Sughrue Mion, PLLC

(57) ABSTRACT

A semiconductor device includes a plural number of interconnects and a plural number of vias are stacked. A semiconductor element is enclosed in an insulation layer. At least one of the vias provided in insulation layers and/or at least one of interconnects provided in the interconnect layers are of cross-sectional shapes different from those of the vias formed in another one of the insulation layers and/or interconnects provided in another one of the interconnect layers.

23 Claims, 23 Drawing Sheets

US 8,304,915 B2

SEMICONDUCTOR DEVICE AND METHOD FOR MANUFACTURING THE SAME

CROSS REFERENCE TO RELATED APPLICATIONS

This application is a National Stage of International Application No. PCT/JP2009/063156 filed Jul. 23, 2009, which claims priority from Japanese Patent Application No. 2008-190100 filed Jul. 23, 2008, the contents of all of which are incorporated herein by reference in their entirety.

TECHNICAL FIELD

This invention relates to a semiconductor device and a method for manufacturing the same. More particularly, it relates to a semiconductor device in which a semiconductor clement is enclosed in a coreless wiring substrate and covered by an insulating layer of resin, for example, and in which multilevel interconnect layers and multilevel insulation layers are stacked thereon. The present invention also relates to the method for manufacturing the semiconductor device.

BACKGROUND

Recently, a need is fell towards miniaturizing and enhancing the function and performance of electronic equipment, such that a technique for high density assembling of a semiconductor package has become indispensable. So far, a build-up substrate having a core layer has preferentially been used as an interposer substrate for a semiconductor package. However, the through-hole (TH) and the interconnect line width of a core substrate arc several times as long as the via diameter and the interconnect line width of the build-up layers. Such dimensional difference has so far been deterrent to increasing the operating speed and to realization of the high-density miniaturized interconnects. On the other hand, one of the sides of the build-up substrate is a layer unneeded as long as designing is concerned. However, it is provided to prevent the warping of the substrate, thus raising the cost. Hence, a coreless substrate, which is an all-layer build up substrate, not including a core layer, is sought to improve the operating speed and density as well as to reduce the cost.

On the other hand, in interconnecting a conventional interposer substrate (interconnect substrate) and a semiconductor element, a wire bonding, employing a gold wire or the like, or a flipchip method, employing a solder ball, has so far been used. However, both of these methods suffer from drawbacks. The wire bonding method is meritorious in reducing the cost. However, if the pitch is to be reduced, the wire diameter is to be decreased, thus possible leading to wire breakage or to a narrow connection condition. The flip-flop connection allows for high-speed signal transmission as compared to the wire bonding technique. However, in case the number of terminals of the semiconductor element is increased, or a connection pitch is narrowed, the connection strength of the solder bumps tends to be decreased, thus possibly producing cracking at the sites of connection or causing failures in connection due to voids. For this reason, a so-called semiconductor element enclosing substrate, in which a semiconductor element is enclosed in an interconnect substrate, and in which interconnects are directly led out at electrode terminals of the semiconductor element, has recently been proposed. This semiconductor element enclosing substrate has realized a high degree of integration and raised the functions of the semiconductor device. In addition, it has a number of advantages, including a thinner package, low cost, accommodation to high frequency and low-stress connection based on the plating technique.

In Patent Document 1, an IC chip is enclosed in a core substrate, and a transition layer is provided on a die pad of the IC chip, whereby electrical connection to the IC chip may be directly established without the interposition of a lead member.

In Patent Document 2, a multilevel substrate enclosing an electronic component is disclosed, in which the diameter of a transition layer 129 is set so as to be smaller than the diameter of a pad 127 and larger than an opening diameter 128a of a passivation film 128 that coats the pad, as shown in FIG. 19. By this arrangement, it is possible to prevent a crack in the passivation layer from an edge of the transition layer.

In Patent Document 3, which is not related with an interconnect substrate enclosing a semiconductor element, discloses providing a pad for connection to an electrical element and a terminal pad for connection to an external circuit on front and back sides of a multilevel interconnect substrate, as shown in FIG. 20. The diameter A of a via connecting to the electrical element is set so as to be smaller than the diameter B of a pad for connection to the external circuit.

[Patent Document 1] JP Patent Kokai Publication No. JP-P2001-339165A
[Patent Document 2] JP Patent Kokai Publication No. JP-P2004-288711A
[Patent Document 3] JP Patent Kokai Publication No. JP-P2005-72328A

SUMMARY

It should be noted that the total contents of the disclosure of the Patent Documents 1 to 3 are to be incorporated herein by reference.

The Following Analysis is Made by the Present Invention.

In case the build-up substrate including a core layer is used as an interposer substrate for a semiconductor package, the through-hole (TH) and the interconnect line width of a core substrate are several times as long as the via diameter and the interconnect line width of the build-up layer. Such dimensional difference has so far been obstructive to increasing the operating speed and to realization of the miniaturized high density interconnects. On the other hand, a coreless substrate, not employing a core layer for an interconnect layer, as compared to the build-up substrate, allows for increasing the operating speed and for realizing a miniaturized high density interconnection. However, in the coreless substrate, interconnect structures are stacked sequentially on a support. It has been known that, with the coreless substrate, if the number of layers is increased, the yield is deteriorated in proportion to powers of the number of layers. In the coreless substrate, connected to narrow-pitch multi-pin semiconductor elements, use of a multilevel configuration is felt to be mandatory. It is thus indispensable that the multilevel configuration of the interconnect substrate enclosing the semiconductor element is of high yield.

The interconnect substrate enclosing a semiconductor element may be implemented on the condition that the semiconductor element enclosed is of a proven quality. It is thus indispensable that the manufacturing method for the interconnect substrate enclosing the semiconductor element is of a high yield.

Conventionally, for the insulation layers stacked on a build-up substrate, the insulation materials or the thicknesses of the insulation layers were not changed from layer to layer. This is possibly due to the general concern that, if the insulation materials are changed, the stacking conditions, via forming conditions or the interconnect forming conditions are drastically changed, thus possibly affecting the process cost as well as the yield.

On the other hand, in light of process constraints and reliability, it is required that the aspect ratio, viz., the via height to via diameter ratio, is on the order of unity (1). If the aspect ratio exceeds 1, the covering power of electroplating to the inside of the via is deteriorated, thus producing defects in via connection points. If the aspect ratio is not higher than 1, the covering power of electroplating to the inside of the via is good. However, if a thin insulation layer is adopted, there is a fear of shorts of the inter-layer interconnection. The high yield in fabrication of a multilevel interconnects may thus be hardly expected.

Recently, the tendency of the semiconductor element is towards higher performance. Hence, in the near future, the tendency of the semiconductor element enclosing substrate is thought to be towards the narrow-pitch multi-pin configuration. In this case, with the interconnection design rule or the via diameters of the current status of the art, it is difficult to have the total of signals output at the electrode terminals of the semiconductor element. Hence, miniaturization of the interconnection design rule, such as L/S of 5 to 20 μm, and the smaller via diameter, such as 10 to 30 μm, are thought to be indispensable. However, since the miniaturization of the interconnection design rule and the smaller via diameter affect the yield, it may be surmised that yield-related problems will be presented with increase in the number of layers. The above mentioned Patent Documents 1 to 3 are not up to solution of the above problems.

It is an object of the present invention to provide a semiconductor device of high yield and high reliability in which narrow-pitch multi-pin semiconductor elements are enclosed in a coreless interconnect substrate (semiconductor element enclosing substrate), and a method for manufacturing the semiconductor device. With the semiconductor device and the manufacturing method therefor, the number of layers of the coreless interconnect substrate is to be increased without deteriorating the yield.

In one aspect, the present invention provides a semiconductor device comprising at least a semiconductor element comprising an electrode terminals on its surface, and a coreless substrate including enclosed therein the semiconductor element. The coreless substrate includes a plurality of stacked interconnect layers and a plurality of stacked insulation layers, interconnects formed in the interconnect layers, and vias each formed in one of the insulation layers and that electrically interconnects between the interconnects above and below the insulation layer. The coreless substrate further includes external connection terminals on its surface. The semiconductor element is embedded in one of the insulation layers. Each of the external connection terminals and each of the electrical terminals are electrically interconnected via at least one of the interconnects or the vias. The insulation layers and the interconnect layers are stacked on one side of the semiconductor element. The cross-sectional shape of at least one of the vias differs from that of the via in another one of the insulation layers, or the cross-sectional shape of at least one of the interconnects differs from that of the interconnect provided in another one of the interconnect layers.

In the present invention, the expression 'cross-sectional shapes of the interconnects' denote the minimum interconnect line width, minimum pitch between neighboring interconnects and the interconnect thicknesses. The expression 'different cross-sectional shape' denotes such a cross-sectional shape in which at least one of the above mentioned parameters differs from that of other cross-sectional shapes.

In another aspect, the present invention provides a method of manufacturing a semiconductor device. The method includes placing a semiconductor element on a support with a surface of the semiconductor element provided with an electrode terminal facing towards a front side, and forming a first interconnect structure. The first interconnect structure includes an insulation layer that covers the semiconductor element, an interconnect layer provided on the insulation layer, and a via bored through the insulation layer to interconnect the electrode terminal and the interconnect layer. The method also includes forming a second interconnect structure on the first interconnect structure. The forming the second interconnect structure is repeated at least once. At least once of the forming the second interconnect structure includes newly forming a via or an interconnect of the cross-sectional shape different from the via or the interconnect of the interconnect layer formed previously.

According to the present invention, there is provided a semiconductor device of a high yield and high reliability, and a method for manufacturing the semiconductor device with ease at a reduced cost. In the semiconductor device of the present invention, interconnect structures that are optimum from one layer to the next may be constructed even though the semiconductor elements enclosed within the coreless multilevel interconnect substrate are of the narrow-pitch multi-pin configuration.

EXPLANATION OF REFERENCE NUMERALS

Figure 1:
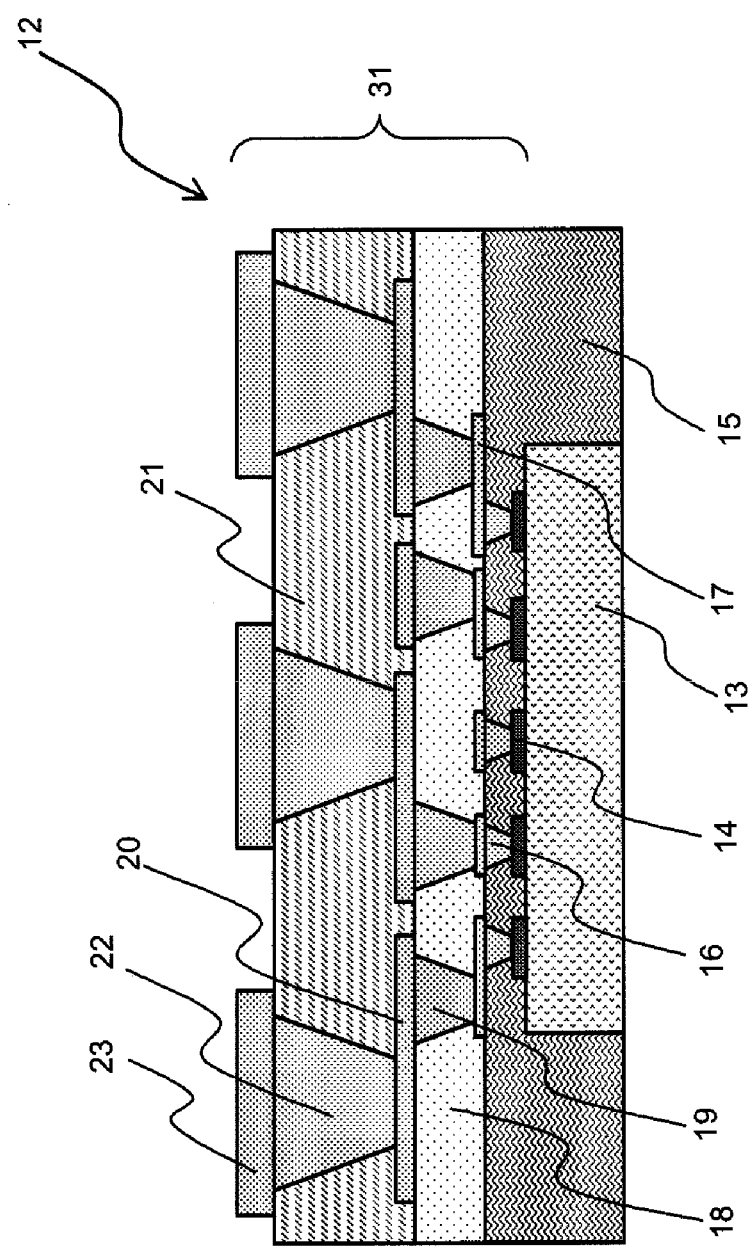
FIG. 1 is a cross-sectional view showing a semiconductor device according to an exemplary embodiment 1 of the present invention.

Refer to the end of the Description for explanation of symbols.

PREFERRED MODES

Certain preferred exemplary embodiments of the present invention will now be summarized with reference to the drawings as necessary.

Referring to FIGS. 1 to 10 and 21 to 23, a semiconductor device according to a preferred exemplary embodiment is a semiconductor device 12 including at least a semiconductor element 13 and a coreless interconnect substrate 31 including enclosed therein the semiconductor element 13. The semiconductor element 13 carries a plurality of electrode terminals 14 on its surface. The coreless interconnect substrate 31 includes a plurality of interconnect layers (17, 20, 23), stacked together, a plurality of insulation layers (15, 18, 21), also stacked together, a plurality of interconnects (17, 20, 23), provided in the interconnect layers, and a plurality of vias (16, 19, 22, 30) provided in the insulation layers and electrically interconnecting the interconnects above and below the insulating layers. On the surface of the coreless interconnect substrate 31, there are provided a plurality of external connection terminals 23. The semiconductor element 13 is embedded in the insulation layer. The external connection terminal 23 and the electrode terminal 14 are electrically interconnected through at least one of the interconnects and the vias. The insulation layers (15, 18, 21) and the interconnects (17, 20, 23) are stacked on one side of the semiconductor element 13. At least one of the vias (16, 19, 22, 30) and the interconnects (17, 20, 23) has a cross-sectional profile different from that of the vias and/or the interconnects provided on the other insulation layers or the interconnect layers.

As shown in FIGS. 1 to 10, 22 and 23, in the semiconductor device of an exemplary embodiment of the present invention, the cross-sectional shape of the vias (16, 30) closest to the electrode terminal 14 may be the smallest of the vias (16, 19, 22, 30).

Moreover, as shown in FIGS. 1 to 10, 22 and 23, in the semiconductor device of an exemplary embodiment of the present invention, the cross-sectional shapes of the vias (16, 19, 22, 30) may be increased stepwise from the vias (16, 30) closest to the electrode terminal 14 towards the vias 22 on the side the connection terminals 23. The number of steps may be increased as appropriate.

In the semiconductor device of an exemplary embodiment of the present invention, the cross-sectional shapes of the vias (16, 19, 22, 30) may be increased from the layer 16 closest to the electrode terminal 14 towards the layer 22 on the side of the external connection terminals 23, from one layer to the next, as the substantially similar cross-sectional shapes of the vias is maintained, as shown in FIGS. 1 to 10, 22 and 23. To maintain the substantially similar cross-sectional shapes of the vias, it is desirable to increase the via diameter from one layer to the next, while it is also desirable to increase the height of the via, viz., the thickness of each insulation layer, from one layer to the next. It is desirable for the ratio of the via height to its diameter, viz., the aspect ratio of the via, not to depart from a range of 0.3 to 3. In case the aspect ratio is less than 0.3, layer-to-layer shorts may be produced due to the inappropriate value of the via height (height of the insulation layer) to the via diameter, or the density of data storage may not be increased as desired due to the excessive via diameter. If, on the other hand, the aspect ratio exceeds 3, it may be difficult to form an interconnect in the via, thus possibly causing failures in line connections.

As shown in FIGS. 1 to 10, 21 and 23, in the semiconductor device of an exemplary embodiment of the present invention, the cross-sectional shapes of the interconnects (17, 20, 23) may become smallest at the layer 17 closest to the electrode terminals 14. If the semiconductor element 13 has narrow-pitch electrode terminals 14, but the closest layer 17 is designed as a fan-out layer, the narrow-pitch interconnects connected to the electrode terminals 14 may be led out at the closest layer 17, so that the interconnect layers (20, 23) on the side the external connection terminal 23 may be laid at a more relaxed pitch.

As shown in FIGS. 1 to 10, 21 and 23, in the semiconductor device of an exemplary embodiment of the present invention, the cross-sectional shapes of the interconnects (17, 20, 23) may be increased stepwise from the layer 17 closest to the electrode terminal 14 towards the layer 23 on the side the external connection terminals.

As shown in FIGS. 1 to 10, 21 and 23, in the semiconductor device of an exemplary embodiment of the present invention, the pitch of the electrode terminals 14 may be narrower than that of the external connection terminals 23.

As shown in FIGS. 1 to 10, 22 and 23, in the semiconductor device of an exemplary embodiment of the present invention, the diameters of the vias, out of the vias (16, 19, 22), lying towards the external connection terminals 23, may be larger than those lying on the side the electrode terminals 14.

As shown in FIGS. 4, 5, 8 and 9, in the semiconductor device of an exemplary embodiment of the present invention, the insulation layer 15 that seals the surface of the electrode terminal of the semiconductor element 13 and the insulation layers (29, 26, 25) that seal the lateral side of the semiconductor element 13 may differ from each other.

Figure 6:
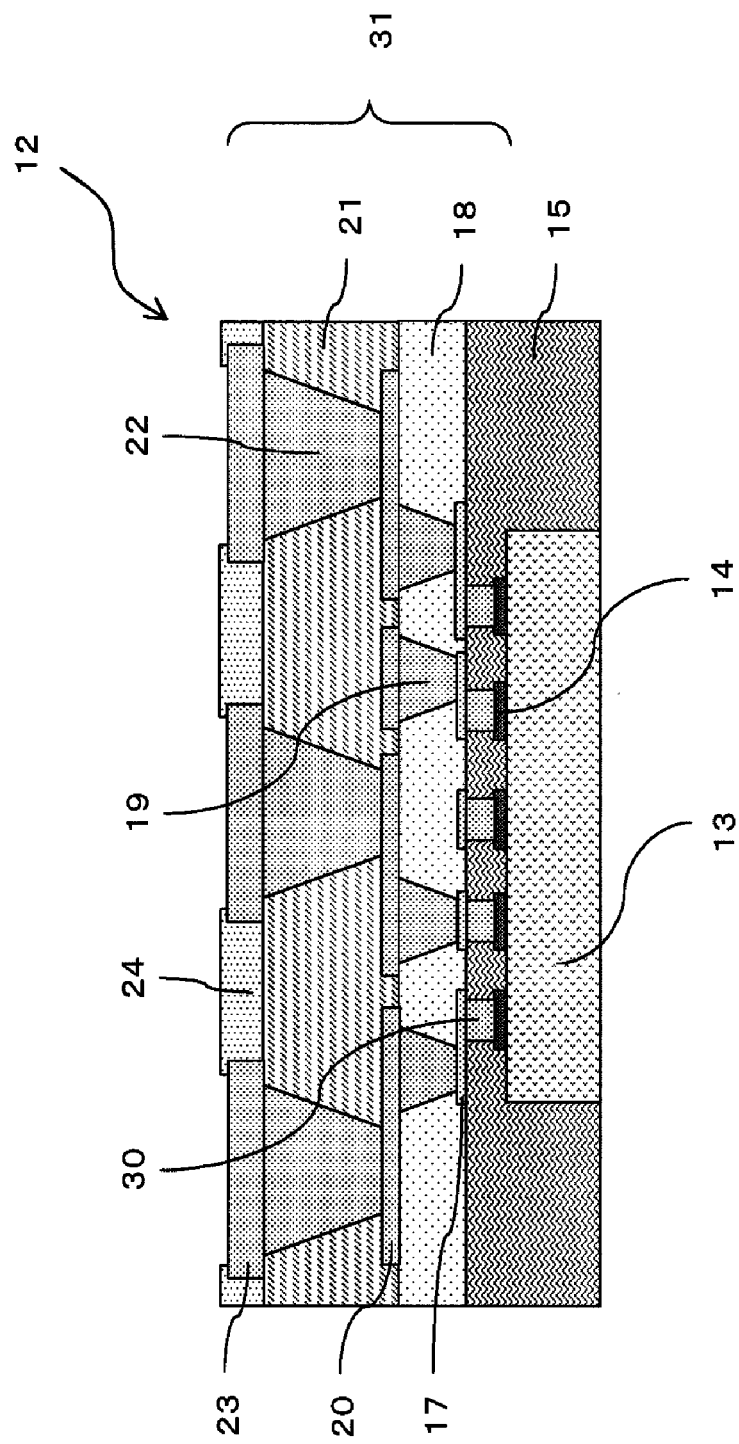
FIG. 6 is a cross-sectional view showing a semiconductor device according to an exemplary embodiment 3 of the present invention.

As shown in FIG. 6, in the semiconductor device of an exemplary embodiment of the present invention, a metal post 30 may be provided on the electrode terminal 14 of the semiconductor element 13, with the metal post 30 operating as the via 16.

Figure 7:
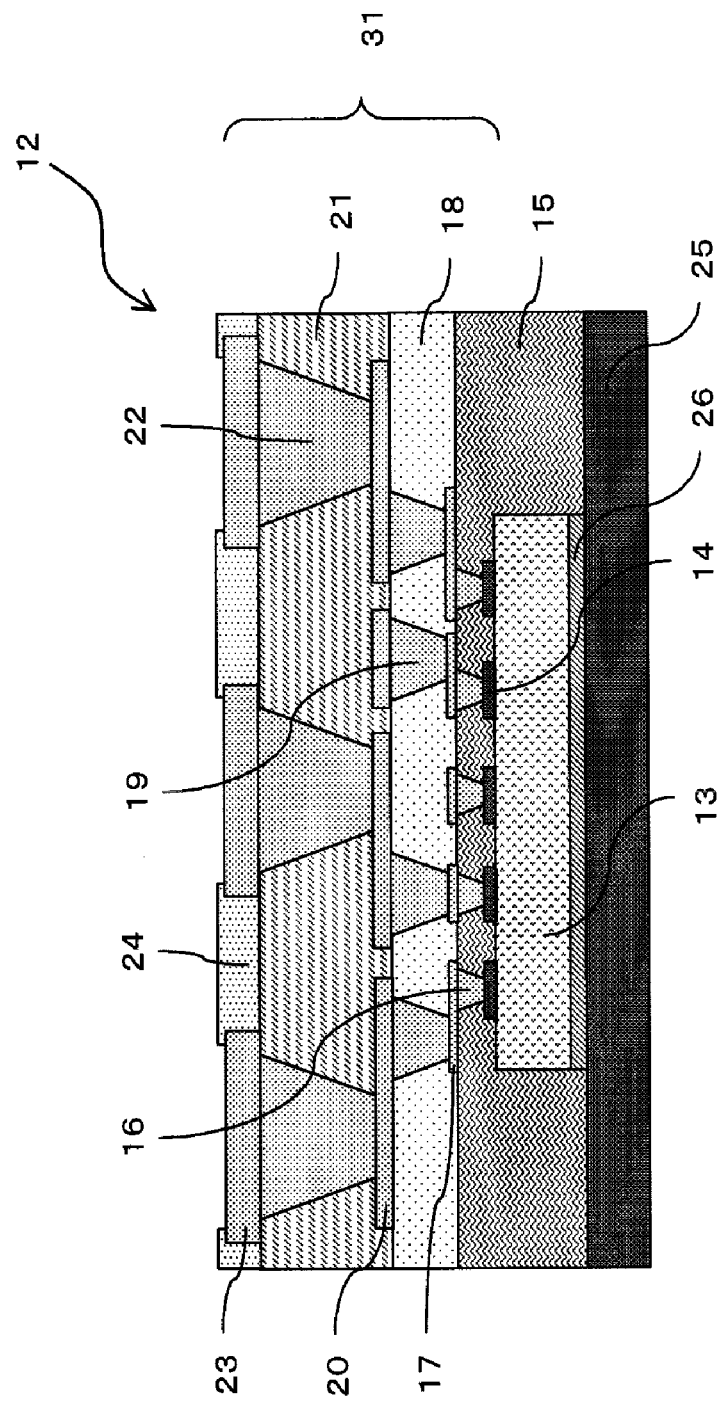
FIG. 7 is a cross-sectional view showing a semiconductor device according to an exemplary embodiment 4 of the present invention.
Figure 8:
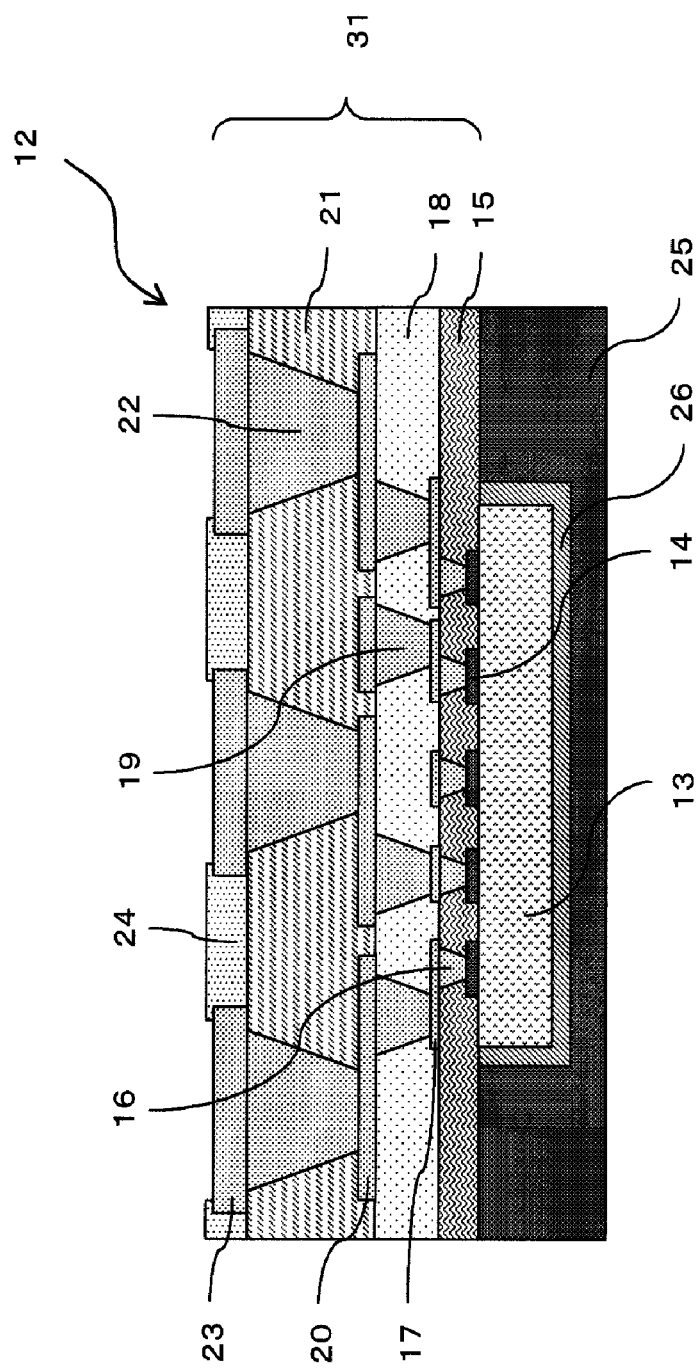
FIG. 8 is a cross-sectional view showing a semiconductor device according to a modification 1 of the exemplary embodiment 4.

As shown in FIGS. 7 and 8, in the semiconductor device of an exemplary embodiment of the present invention, a support 25 may be provided on a surface of the semiconductor device opposite to its side carrying the electrode terminal 14 of the semiconductor element 13.

Figure 10:
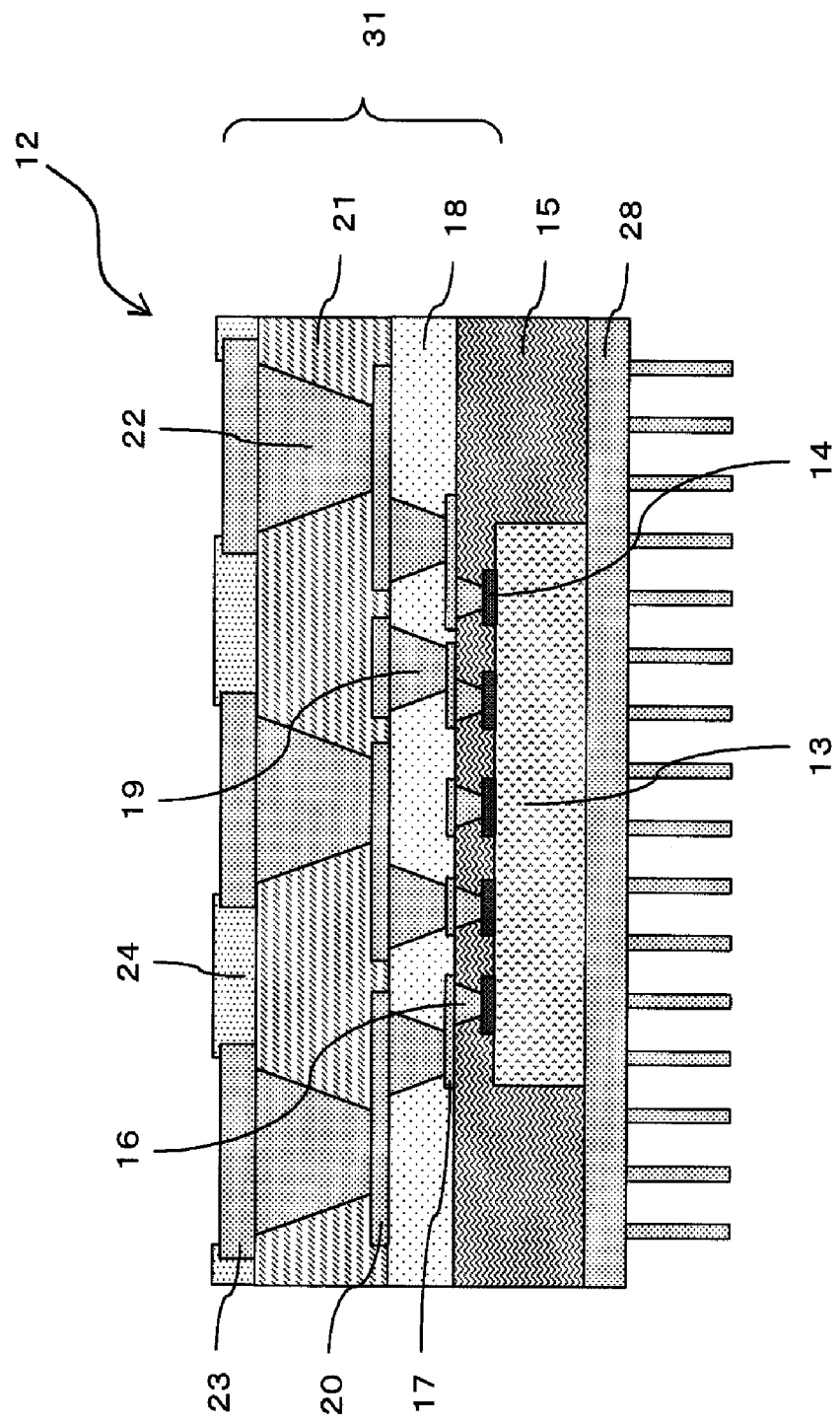
FIG. 10 is a cross-sectional view showing a semiconductor device according to a modification of the exemplary embodiments 1 to 4.

As shown in FIG. 10, in the semiconductor device of an exemplary embodiment of the present invention, a heat sink 28 may be provided on a side of the semiconductor device opposite to its side carrying the electrode terminals 14 of the semiconductor element 13.

Figure 11:
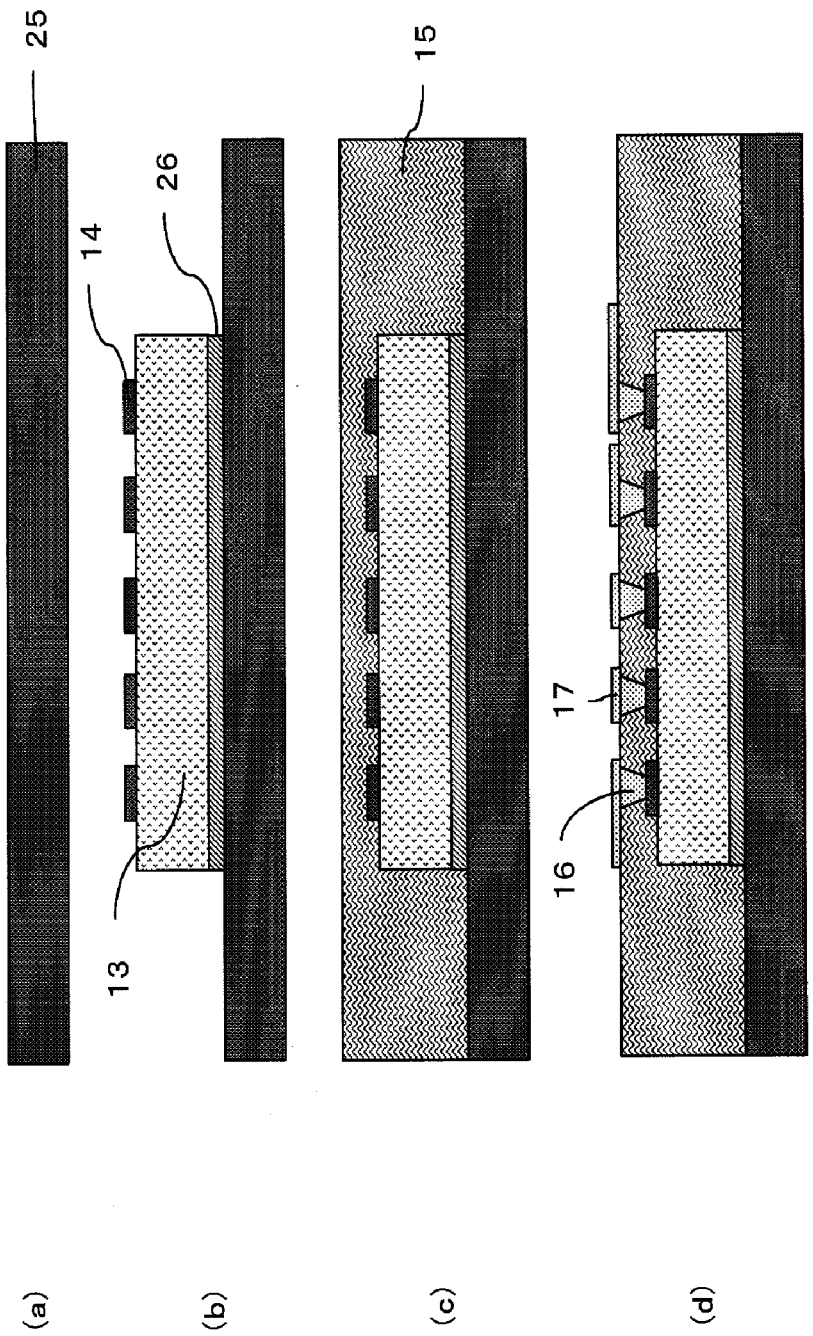
FIG. 11 illustrates cross-sectional views showing process steps of a manufacturing method for a semiconductor device according to an exemplary embodiment 5 of the present invention.
Figure 12:
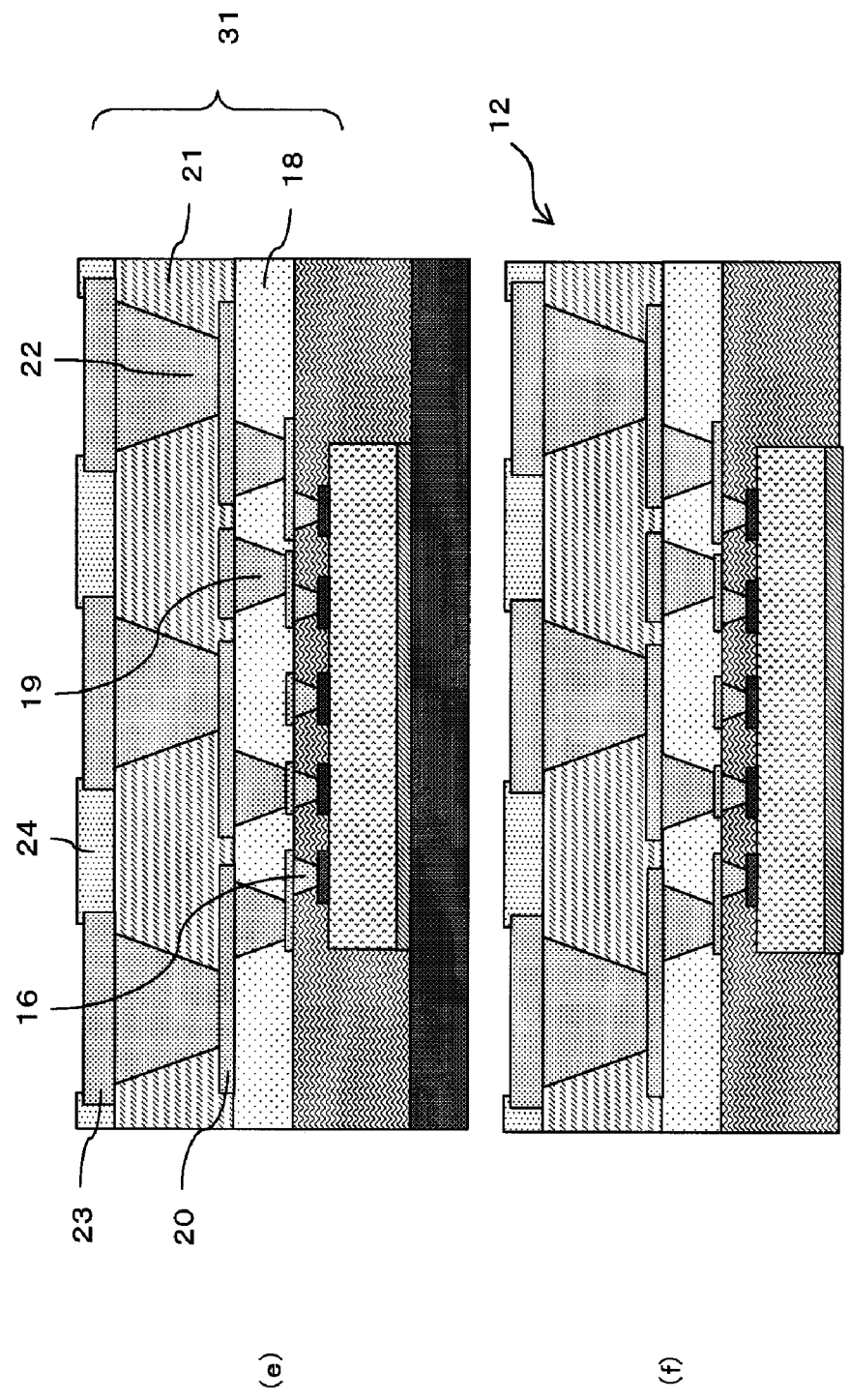
FIG. 12 illustrates cross-sectional views showing process steps carried out following those of (a) to (d) of FIG. 11.
Figure 13:
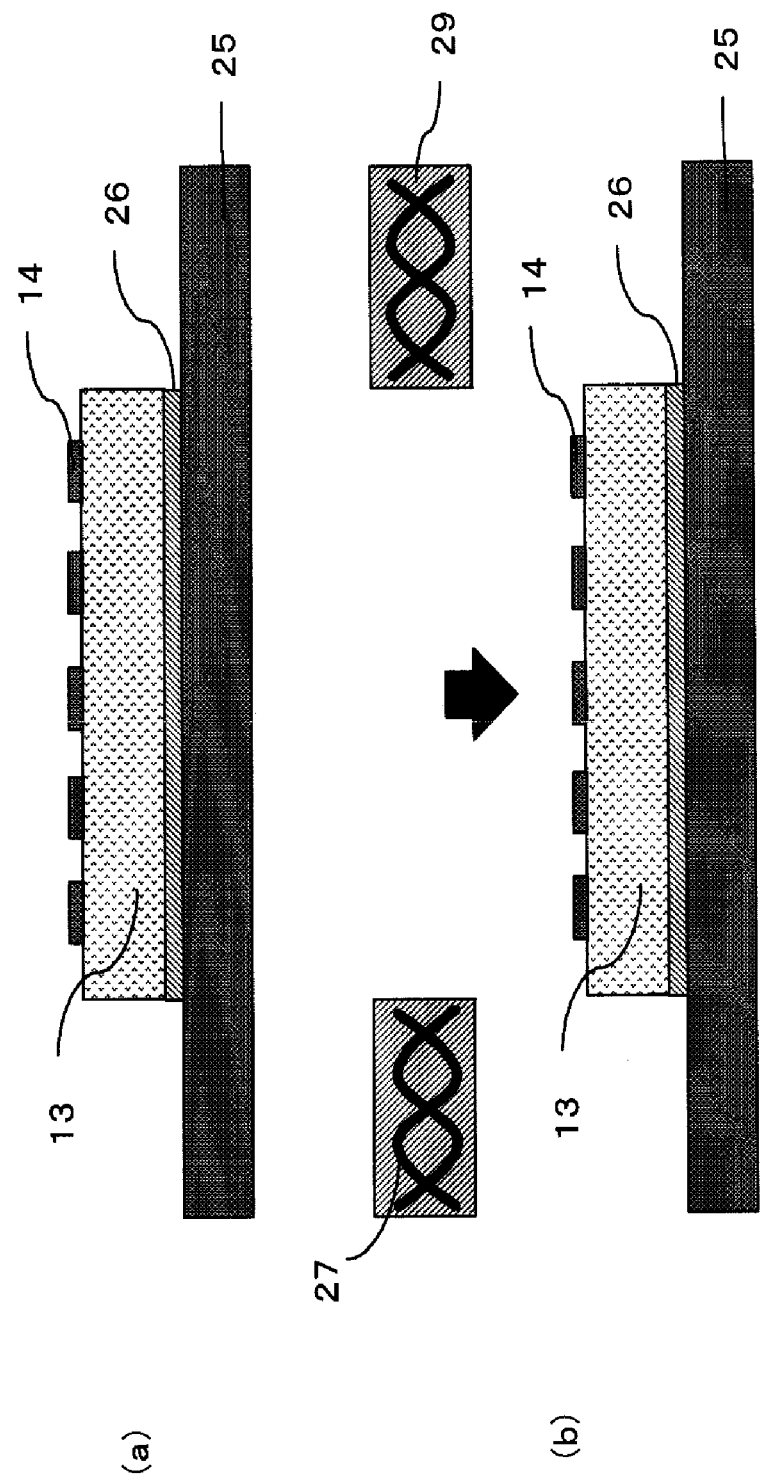
FIG. 13 illustrates cross-sectional views showing process steps of a method for manufacturing a semiconductor device according to an exemplary embodiment 6 of the present invention.
Figure 14:
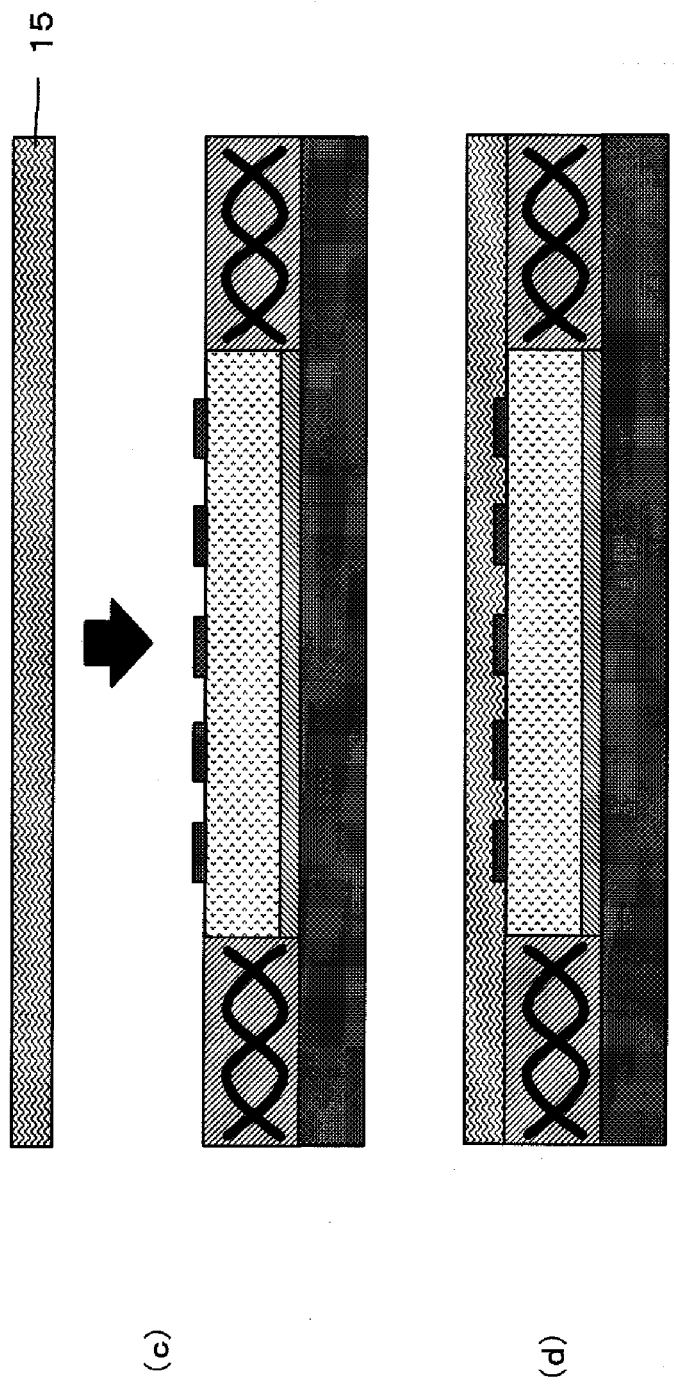
FIG. 14 illustrates cross-sectional views showing process steps carried out following those of (a) and (b) of FIG. 13.
Figure 15:
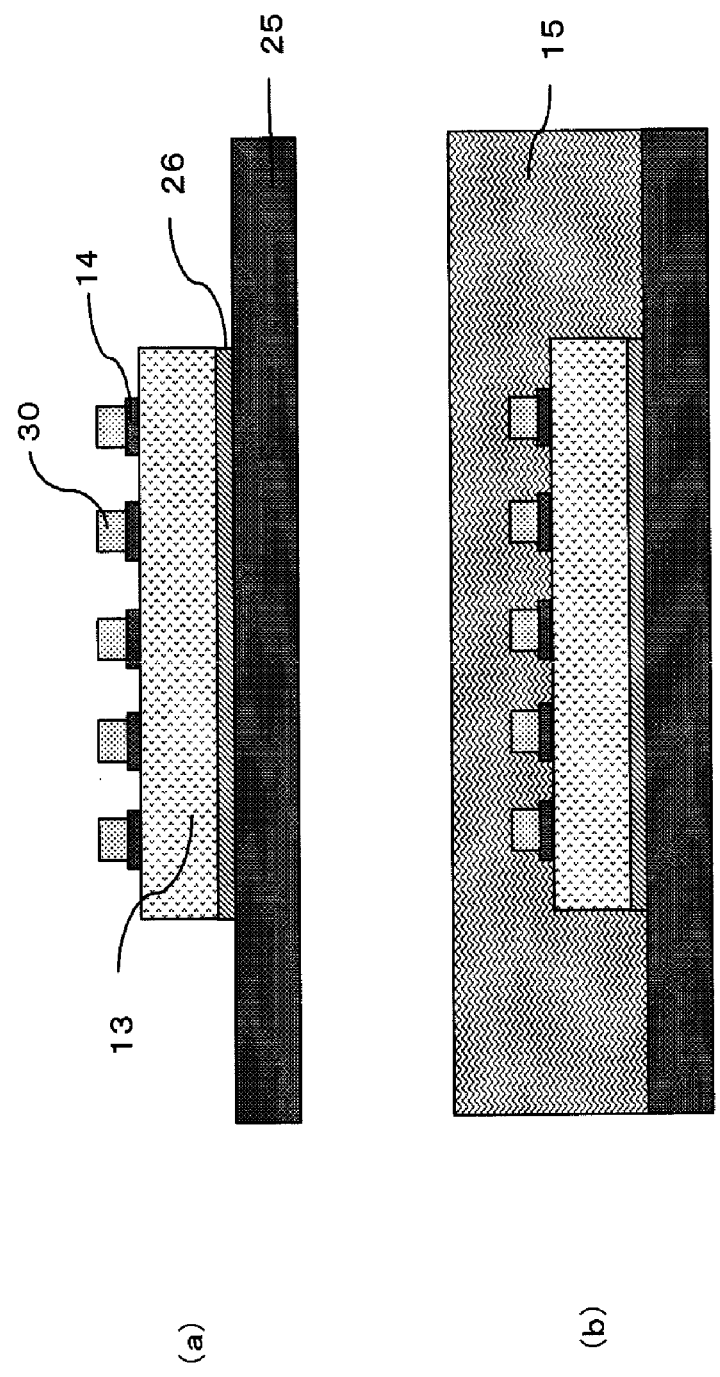
FIG. 15 illustrates cross-sectional views showing process steps of a method for manufacturing a semiconductor device according to an exemplary embodiment 7 of the present invention.
Figure 16:
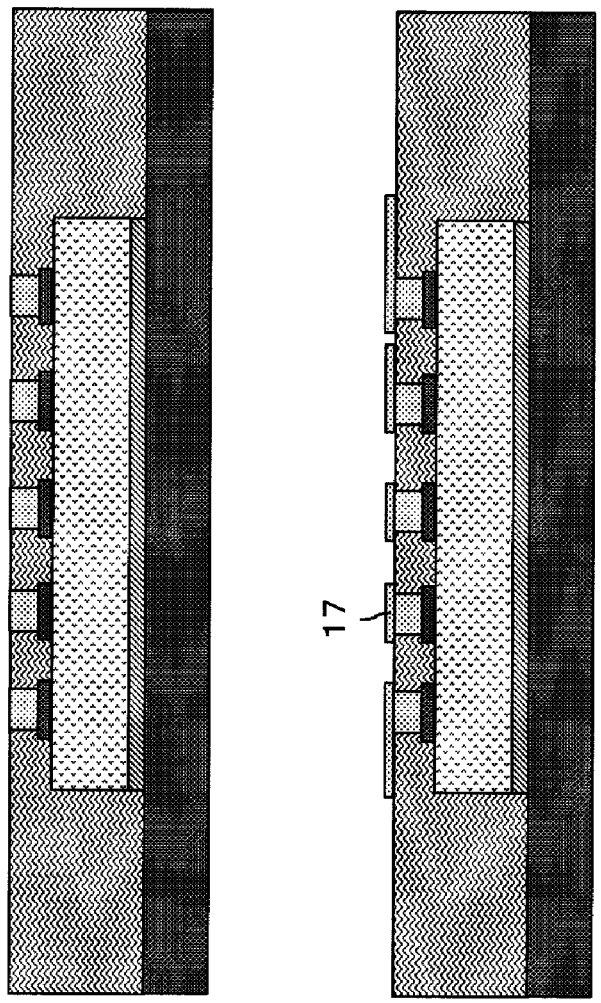
FIG. 16 illustrates cross-sectional views showing process steps carried out following those of (a) and (b) of FIG. 15.

Referring to FIGS. 11 to 18, a method of manufacturing a semiconductor device according to an exemplary embodiment of the present invention comprises placing a semiconductor element on a support with a surface of the semiconductor element provided with an electrode terminal 14 facing towards a front side ((b) of FIG. 11, (a) of FIG. 13, (a) of FIG. 15 and (b) of FIG. 16). The method also includes forming a first interconnect structure including insulation layers (15, 29) that cover the semiconductor element, an interconnect layer 17 provided on the surface of the insulation layer (15), and vias (16, 30) bored through the insulation layer to interconnect the electrode terminal and the interconnect layer ((d) of FIG. 11, (d) of FIG. 16 and (d) of FIG. 18). The method also includes forming a second interconnect structure ((e) of FIG. 12 and (e) of FIG. 18) of forming further insulation layers (18, 21), vias (19, 22) and interconnect layers (20, 23) on the first interconnect structure to form a second interconnect structure stacked on the first interconnect structure. The forming second interconnect structure is repeated at least once. At least once of the forming the second interconnect structure includes newly forming interconnects (20, 23) or vias (19, 22) of the cross-sectional shapes different from those of the vias (16, 30) or the interconnect of the interconnect layer (17) formed previously.

Figure 17:
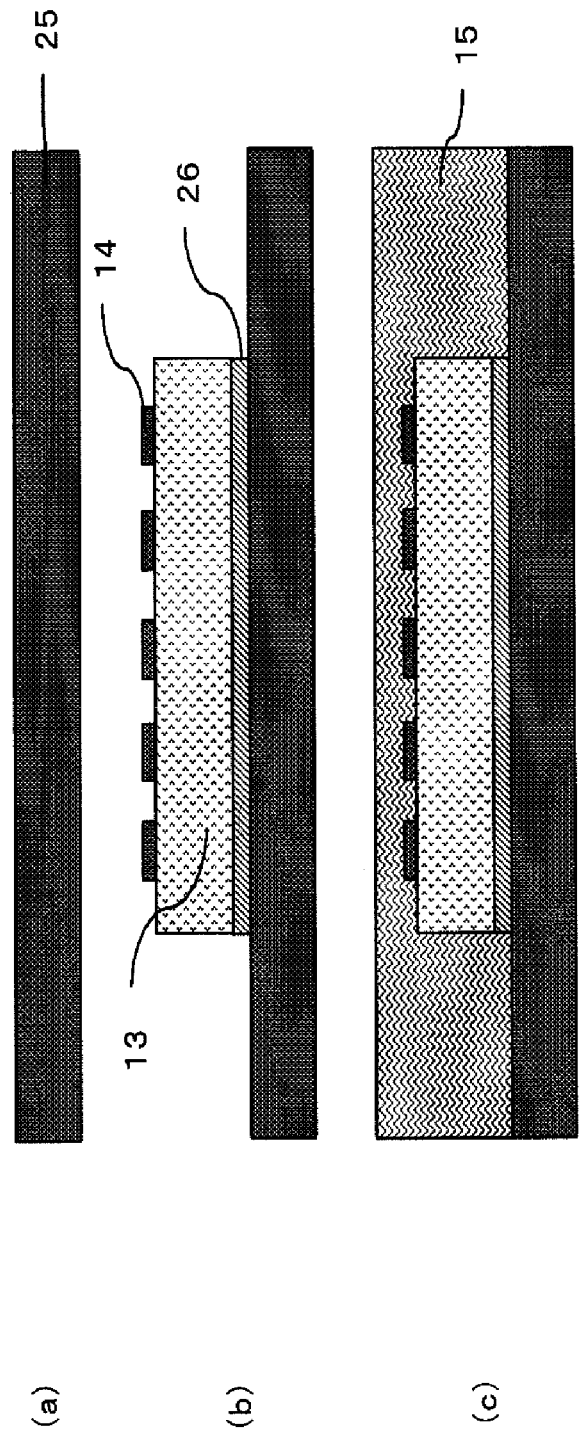
FIG. 17 illustrates cross-sectional views showing process steps of a method for manufacturing a semiconductor device according to an exemplary embodiment 8 of the present invention.
Figure 18:
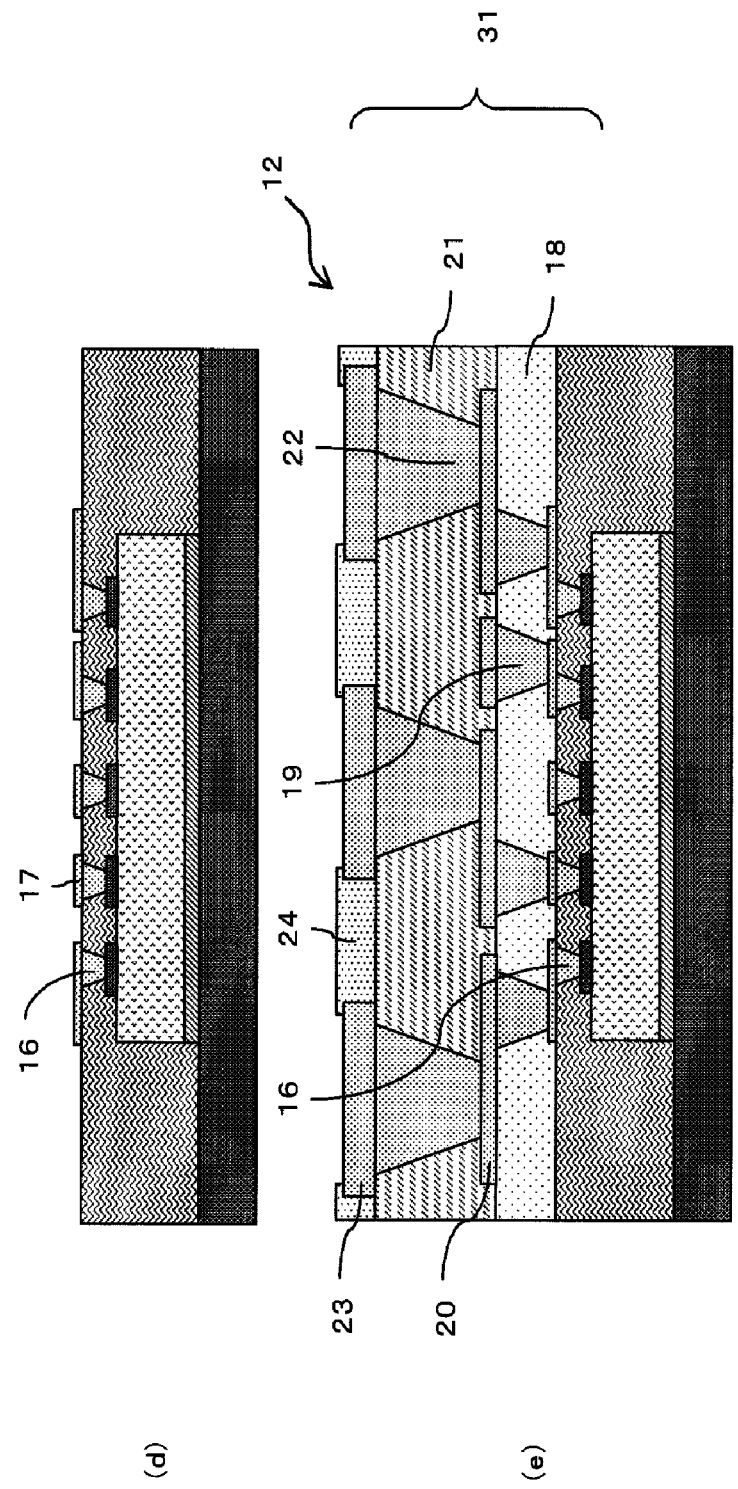
FIG. 18 illustrates cross-sectional views showing process steps carried out following those of FIG. 17.
Figure 19:
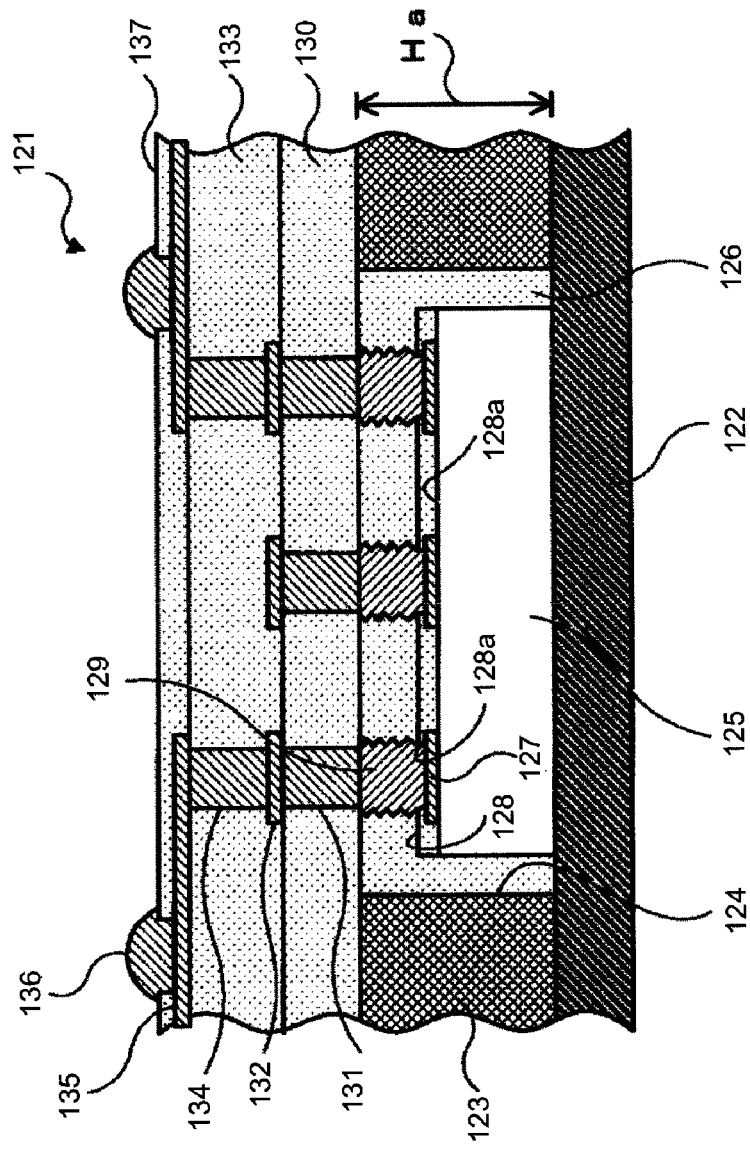
FIG. 19 is a cross-sectional view showing a conventional electronic component enclosing multilevel substrate.
Figure 20:
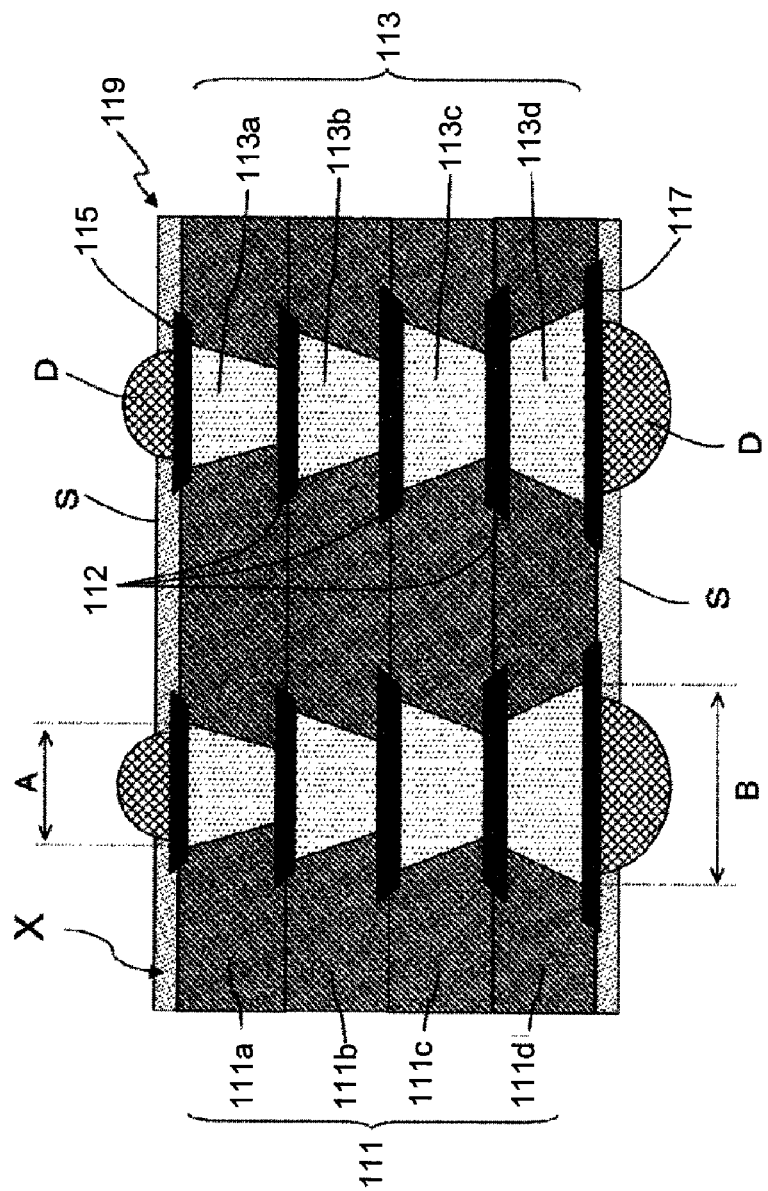
FIG. 20 is a cross-sectional view showing a conventional multilevel interconnect substrate.

As shown in FIGS. 11 to 18, in the method of manufacturing a semiconductor device according to an exemplary embodiment of the present invention, at least once of the forming the second interconnect structure ((e) of FIG. 12 and (e) of FIG. 18) includes newly forming via (19, 22) having a cross-sectional shapes larger than those of the vias (16, 30) formed previously.

As shown in FIGS. 11 to 18, in the method of manufacturing a semiconductor device according to an exemplary embodiment of the present invention, at least once of forming the second interconnect structure includes newly forming an interconnect layer (20, 23) having a cross-sectional shape larger than that of the interconnect formed previously.

As shown in (f) of FIG. 12, the method of manufacturing a semiconductor device according to an exemplary embodiment of the present invention may further comprise removing the support 25 after forming the interconnect structure.

As shown in FIG. 10, the method of manufacturing a semiconductor device according to an exemplary embodiment of the present invention may further comprise forming a heat sink 28 after removal of the support 25.

As shown in FIGS. 13 and 14, in the method of manufacturing a semiconductor device according to an exemplary embodiment of the present invention, forming the first interconnect structure includes forming a first insulation layer 29 on a lateral surface of the semiconductor element 13 ((b) of FIG. 13) and forming a second insulation layer 15 different in material type from the first insulation layer 29 on the surface of the first insulation layer 29 and on the surface of the semiconductor element 13 ((c) of FIG. 14).

As shown in FIGS. 15 and 16, in the manufacturing method for a semiconductor device according to an exemplary embodiment of the present invention, the semiconductor element 13 includes a metal post provided on the surface of the electrode terminals 14. The forming the first interconnect structure includes forming an insulation layer 15 that covers the semiconductor element 13 ((b) of FIG. 15) and removing part of the insulation layer 15 to expose the surface of the metal post 30 ((c) of FIG. 16) and forming an interconnect layer on a surface of the metal post 30 exposed and on a surface of the insulation layer 15 ((d) of FIG. 16). The metal post 30 may operate as via 16.

The preferred exemplary embodiments of the present invention will now be described with reference to the drawings.

[Exemplary Embodiment 1]

FIG. 1 depicts a cross-sectional view showing a semiconductor device according to Exemplary Embodiment 1 of the present invention. In the semiconductor device 12 of FIG. 1, at least a part of the surface of a semiconductor element 13 carrying a plurality of electrode terminals 14 and its lateral side are contacted with an insulation layer A (15). On the upper sides of the electrode terminals 14, there are provided vias A (16), interconnects A (17), an insulation layer B (18), vias B (19), interconnects B (20), an insulation layer C (21) and vias C (22) for interconnecting the electrode terminals 14 and interconnects C (23) which are external connection terminals of the semiconductor device 12. The surface of the semiconductor element 13 opposite to its surface carrying the electrode terminals 14 is exposed from the insulation layer A (15).

Although the number of the respective layers is three in FIG. 1, any suitable plural numbers other than three of the layers may be provided without limitations. In the present exemplary embodiment, there are provided three each of the interconnect layers and the insulation layers.

In FIG. 1, the cross-sectional shapes of the vias are increased in a sequence of the via A (16), via B (19) and the via C (22), whereas the cross-sectional shapes of the interconnects are increased in a sequence of the interconnect A (17), interconnect B (20) and the interconnect C (23). The thicknesses of the insulation layers are increased in a sequence of the insulation layer A (15) between the electrode terminals 14 and the interconnect A (17), insulation layer B (18) and the insulation layer C (21). This formulation is, however, not restrictive. The cross-sectional shapes of the vias or interconnects as well as the thicknesses of the insulation layers may be selected as appropriate. The cross-sectional shapes of the vias may be increased from the side the electrode terminals towards the side the external connection terminals, whilst the insulation layers may be thicker on the side the external connection terminals than on the side the electrode terminals. The cross-sectional shapes of the interconnects may also be enlarged on the external connection terminal side than on the electrode terminal side.

The cross-sectional shape of the via denotes the via top diameter, the via bottom diameter and a height of the via. The cross-sectional shape of the via may be said to be increased when one or more of these three parameters is increased. The top of a via is a side of the via with a larger via diameter, and its bottom is a side of the via with a lesser via diameter. It is preferred that the bottom side of the via is the site of connection of the via to the narrow pitch semiconductor element. However, this connection mode may be reversed. In particular, such a formulation in which the cross-sectional shapes of the vias are increased from the layer proximate to the semiconductor element is desirable in light of the signal quality. It is desirable for the vias of the respective layers not to depart from the aspect ratio, a ratio of the via height to the via diameter, ranging from 0.3 to 3. In case the aspect ratio is less than 0.3, layer-to-layer shorts may be produced due to an inappropriate value of the via height (height of the insulation layer) with respect to the via diameter. Or, the data storage density may not be increased as desired due to an excessively increased via diameter. On the other hand, if the aspect ratio exceeds 3, it may be feared that the interconnects may not be laid with ease in the vias, thus possibly producing failures in making electrical connection. An ideal value of the aspect ratio is approximately unity (1). Thus, in case the via diameters are increased from layer to layer, it is desirable that the via height (thickness of the insulation layer) is increased at the same time as the via diameter is increased.

The cross-sectional shape of an interconnect means a minimum line width as well as the minimum pitch of the interconnects, viz., the interconnect design rule, and the thickness of an interconnect. It is sufficient that one or more of these parameters are increased. The cross-sectional shape of an interconnect may be said to be increased when the pitch and the width undergo transitions from the narrow pitch and the narrow width towards the more moderate or relaxed pitch and the more moderate or relaxed width, as regards the interconnect design rule, and when the thickness of the interconnect undergoes transitions from the thin thickness to thick thickness, as regards the thickness of the interconnect. The cross-sectional shape of an interconnect desirably increases progressively from the layer closest to the semiconductor element.

To implement the semiconductor device of a high yield, it is desirable that the cross-sectional shape of the via as well as that of the interconnect increases progressively from the layer proximate to the semiconductor element 13, with the thickness of the insulation layer increasing simultaneously. Viz., it is desirable that the interconnect design rule progressively transitions, in a direction from the layer proximate to the semiconductor element 13, from the narrow pitch to the relaxed pitch and from the narrow width to the relaxed width, and that the via diameter progressively transitions in the same direction from a smaller diameter to a larger diameter, with the line width transitioning from a thinner thickness to a thicker thickness. However, such is not restrictive. In case there are provided larger numbers of the interconnects and insulation layers, it is not mandatory to change the cross-sectional shapes of the vias or the interconnects or the thicknesses of the insulation layers from one layer to another. Viz., the cross-sectional shapes of the vias or the interconnects or the thicknesses of the insulation layers may be changed stepwise every several layers in a direction from the layer proximate to the semiconductor element 13 towards the external connection terminal.

In case the design rule transitions from the narrow pitch and the narrow line width to the relaxed pitch and the relaxed line width, whereas via diameter transitions from the small diameter to large diameter and the thickness of the insulation layer transitions from the thin thickness to the thicker thickness, the semiconductor device 12 may be improved in reliability.

The thickness of the semiconductor element 13 may be adjusted in keeping with the target thickness of the semiconductor device. In the present exemplary embodiment, the thickness of the semiconductor element 13 may be in a range of from 30 to 50 μm. In FIG. 1, only one semiconductor element 13 is provided, only by way of illustration, such that any suitable number of the semiconductor elements may be provided. Since the surface of the semiconductor element 13 opposite to its surface carrying the electrode terminals 14, referred to below as a back surface of the semiconductor element 13, is flush with the insulation layer A (15), a heat sink or the like component may be mounted in stability to high accuracy on this planar surface of the semiconductor element. On the other hand, in case the back side of the semiconductor element 13 is protruded from the level of the insulation layer A (15), an exposed surface of the semiconductor element 13 is increased, thus improving the heat radiation characteristic. The thickness of the protruded portion of the semiconductor element may also be adjusted by polishing. In case the back surface of the semiconductor element 13 is recessed, it becomes possible to prevent chips or fluffs produced at an edge of the semiconductor element 13. In the present exemplary embodiment, the back surface of the semiconductor element 13 is flush with the insulation layer A (15). In FIG. 1, the external connection terminal 23 is protruded from the insulation layer C (21). However, the external connection terminal 23 may be flush with the insulation layer C (21), as are the electrode terminal 14 and the insulation layer A (15). Or, the external connection terminal 23 may be recessed from the insulation layer C (21)

The insulation layer A (15), insulation layer B (18) and the insulation layer C (21) are formed of a photo-sensitive or non-photo-sensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole), and a polynorbornene resin. It is also possible to use glass cloths and woven or non-woven cloths formed by aramide fibers. These materials are impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin, and are used in this state.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or Varilene, may also be used as the material for the insulation layers.

To implement a high yield semiconductor device, it is desirable to use a photosensitive resin for an insulation resin proximate to the semiconductor element for which the minutest via diameter, minutest design rule and the thinnest insulation layers are requirements. It is also desirable to use, for the next following layer, a non-photo-sensitive resin, in which a via may be formed by UV-YAG laser. For the insulation layer proximate to the external connection terminal, for which the maximum via diameter, the most relaxed design rule and a insulation layer with a thicker thickness are allowed, it is desirable to use a non-photo-sensitive resin, such as glass cloth, impregnated with reinforcement agents, provided that the non-photo-sensitive resin allows for forming a via therein by a $CO_2$ laser. By using an insulation material or a process, suited as to the interconnect design rule, cross-sectional shapes of vias or the insulation layer thicknesses, as required for the respective layers, the high yield desired may be obtained at lower costs.

A variety of meritorious effects may be expected by using variable insulation materials for the different layers. For example, an insulation material of low elasticity may be used for layers in need of miniscule vias, in such a manner as to improve the reliability. An insulation material of high elasticity may be used for a thicker insulation layer to reduce warping in the semiconductor device. In the present exemplary embodiment, an epoxy resin, a non-photo-sensitive resin, is used for the insulation layer A (15), insulation layer B (18) and the insulation layer C (21).

For the interconnects A (17), B (20) and C (23), at least one metal selected from the group consisting of copper, silver, gold, nickel, aluminum and palladium, or an alloy containing the above metal(s) as main component, may be used. From the perspective of the values of the electrical resistance and cost, it is preferred to use copper. In the present exemplary embodiment, copper is used for the interconnects A(17), B(20) and C(23).

For the via A (16), A (19) and C (22), at least one metal selected from the group consisting of copper, silver, gold, nickel, aluminum and palladium, or an alloy containing the above metal(s) as main component, may be used. From the perspective of the values of the electrical resistance and cost, it is preferred to use copper. In the present exemplary embodiment, copper is used for the vias A (16), B (19) and C (22).

[Modification 1 of Exemplary Embodiment 1]

Figure 21:
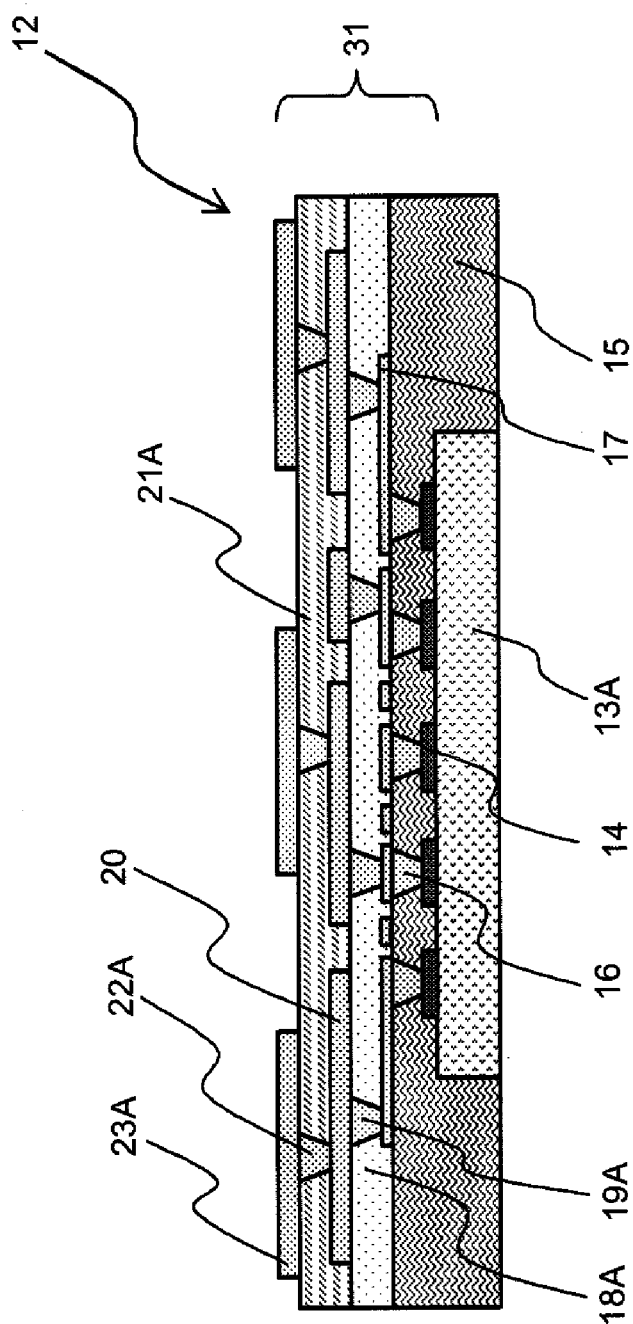
FIG. 21 is a cross-sectional view showing a semiconductor device according to a modification 1 of the exemplary embodiment 1.

FIG. 21 depicts a cross-sectional view of a semiconductor device according to a modification 1 of the exemplary embodiment 1. In FIG. 21, as compared to FIG. 1, the film thicknesses of insulation layers B (18A) and C (21A) are thin and are about equal to that of the insulation layer A (15). The thickness of a semiconductor element 13A is thinner than in FIG. 1. It is thus possible to reduce the overall size of a semiconductor device 12. The cross-sectional shapes of the interconnects B (20) are larger than those of the interconnects A (17), while the cross-sectional shapes of the interconnects C (23A) are about equal to those of the interconnects B (20). The interconnects of the interconnect layers 17 closest to the semiconductor element 13A are laid with a narrow pitch in keeping with the pitch of the electrode terminals 14 of the semiconductor element 13A. The interconnects of the interconnect layer 17 are formed as a fan-out layer. Part of the interconnects led out from the semiconductor element 13A is connected to the vias B (19A) at a further outer side than the semiconductor element 13A to enlarge the pitch of the interconnect layers and the vias in a direction from the closest layer to the external connection terminals. Hence, the laying pitch of interconnects may be enlarged in the interconnect layers (20, 23A) provided on a further outer side from the interconnects A (17) towards the external connection terminals 23A. The cross-sectional shapes of the interconnects may also be enlarged. Thus, even though the electrode terminals 14 are of a narrow pitch, the cross-sectional shapes of the interconnect layers other than the interconnect layer 17 closest to the first electrode terminals 14 may be enlarged in laying the interconnects. The minimum line width and the minimum line pitch of the interconnect layers 17 are 10 μm, while the thicknesses of the interconnect layers 17 are 10 μm. The minimum line width and the minimum line pitch of the interconnect layers 20 and 23 may be 50 μm, while the thicknesses of the interconnect layers 20 and 23 may be 15 μm. Also, since the insulation layer is of a reduced film thickness, the cross-sectional shapes of the via B (19A) and the via C (22A) are about equal to that of the via A (16) so that the aspect ratio will not depart from the optimum range. Viz., in this modification, the cross-sectional shapes of the interconnect layers 17 closest to the semiconductor element 13A are made smaller than those of the other interconnect layers, thereby implementing a semiconductor element enclosing coreless substrate that is thin in thickness and that may be manufactured with a high yield.

[Modification 2 of Exemplary Embodiment 1]

Figure 22:
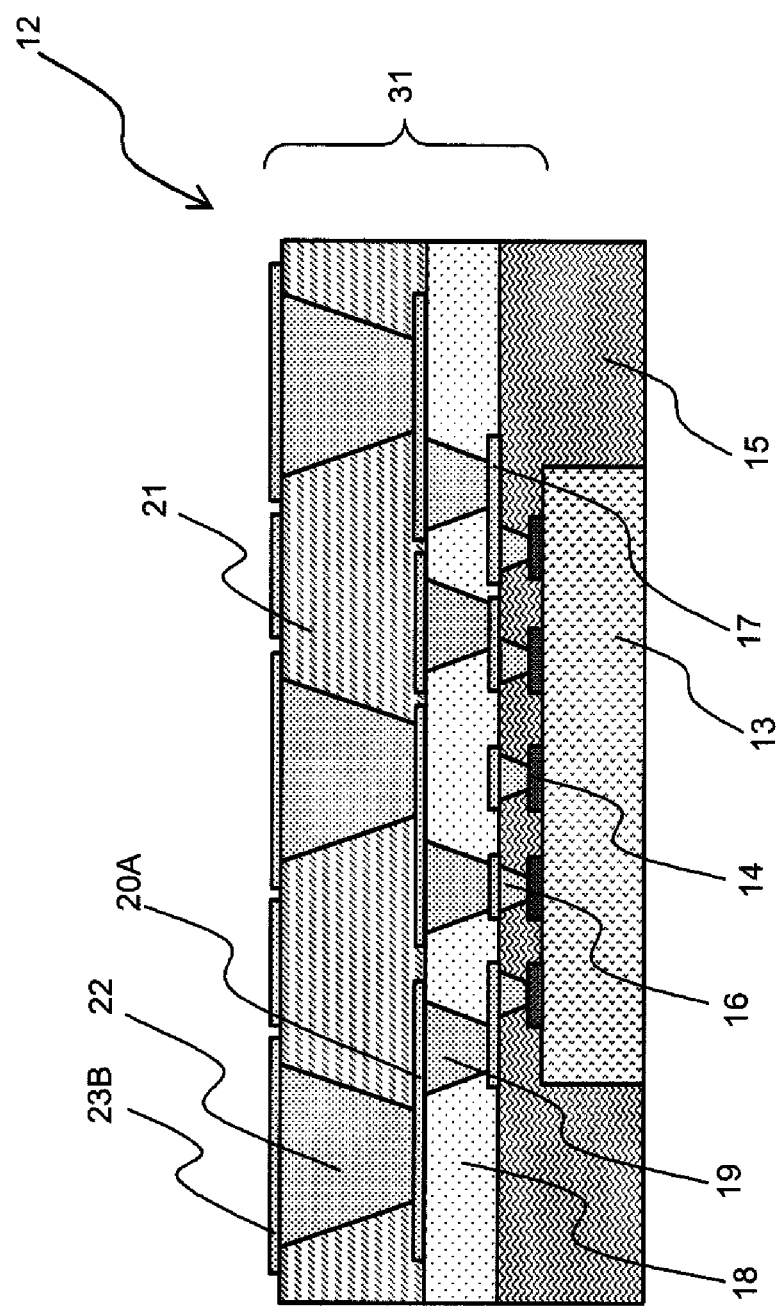
FIG. 22 is a cross-sectional view showing a semiconductor device according to a modification 2 of the exemplary embodiment 1.

FIG. 22 depicts a cross-sectional view of a semiconductor device according to a modification 2 of the exemplary embodiment 1. In FIG. 22, as compared to FIG. 1, the cross-sectional shapes of the interconnects B (20A) and the interconnects C (23B) are about equal to those of the interconnects A (17). In general, in forming miniscule interconnects with a narrow pitch, a high precision interconnect forming technique is needed, and hence the cost tends to be increased. However, if the semiconductor device may be manufactured in stability at low cost in case the interconnect forming process is not changed from one interconnect layer to another, such miniscule interconnect layers that may be used for the total of the interconnects may be used, as shown in FIG. 22. Meanwhile, if there is space allowance for laying the interconnects B (20A) and the interconnects C (23B) in comparison with the interconnects A (17) that need to be delicately laid in keeping with the pitch of the electrode terminals 14, the spare area may be covered by a GND wiring. It is noted that the minimum line width and the minimum line pitch of the interconnects B (20A) and the interconnects C (23B) as determined by the design rule are the same as those of the interconnect A (17). On the other hand, the thicknesses of the interconnects B (20A) and the interconnects C (23B) are equal to those of the interconnects A (17).

[Modification 3 of Exemplary Embodiment 1]

Figure 23:
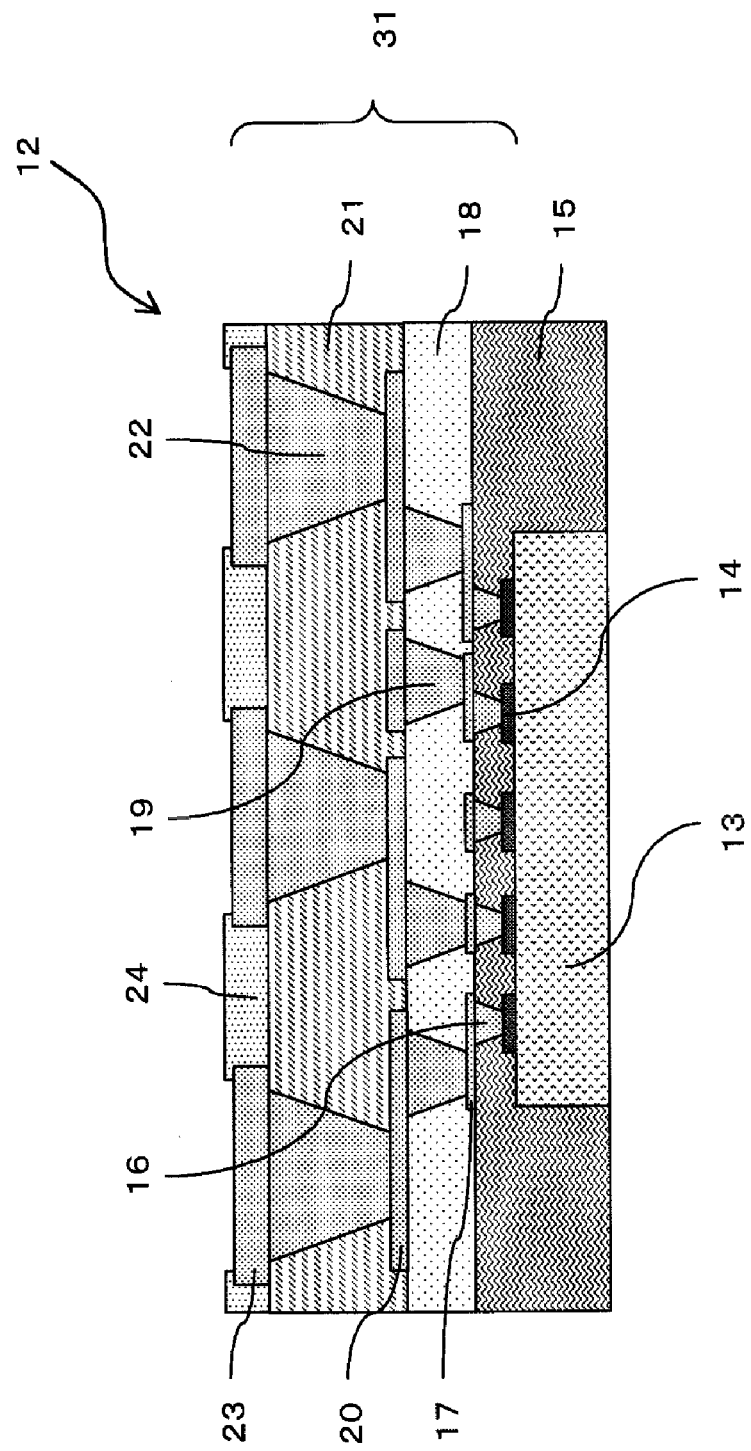
FIG. 23 is a cross-sectional view showing a semiconductor device according to a modification 3 of the exemplary embodiment 1.

FIG. 23 depicts a cross-sectional view of a semiconductor device according to a modification 3 of the exemplary embodiment 1. In FIG. 23, a solder resist 24 is provided on the upper most surface of the semiconductor device 12 by partially opening the interconnect C (23). The solder resist 24 is provided by exposing part of the interconnect C (23), and covers its remaining part. In the present modification, a photoresist ink was used as the material of the solder resist 24. The surface opened from the solder resist 24 may be formed of at least one metal or alloy selected from the group consisting of gold, silver, copper, tin and a solder material. In the present exemplary embodiment, nickel and gold were deposited to thicknesses of 3 μm and 0.5 μm, in this order, respectively.

[Other Modifications of Exemplary Embodiment 1]

Figure 3:
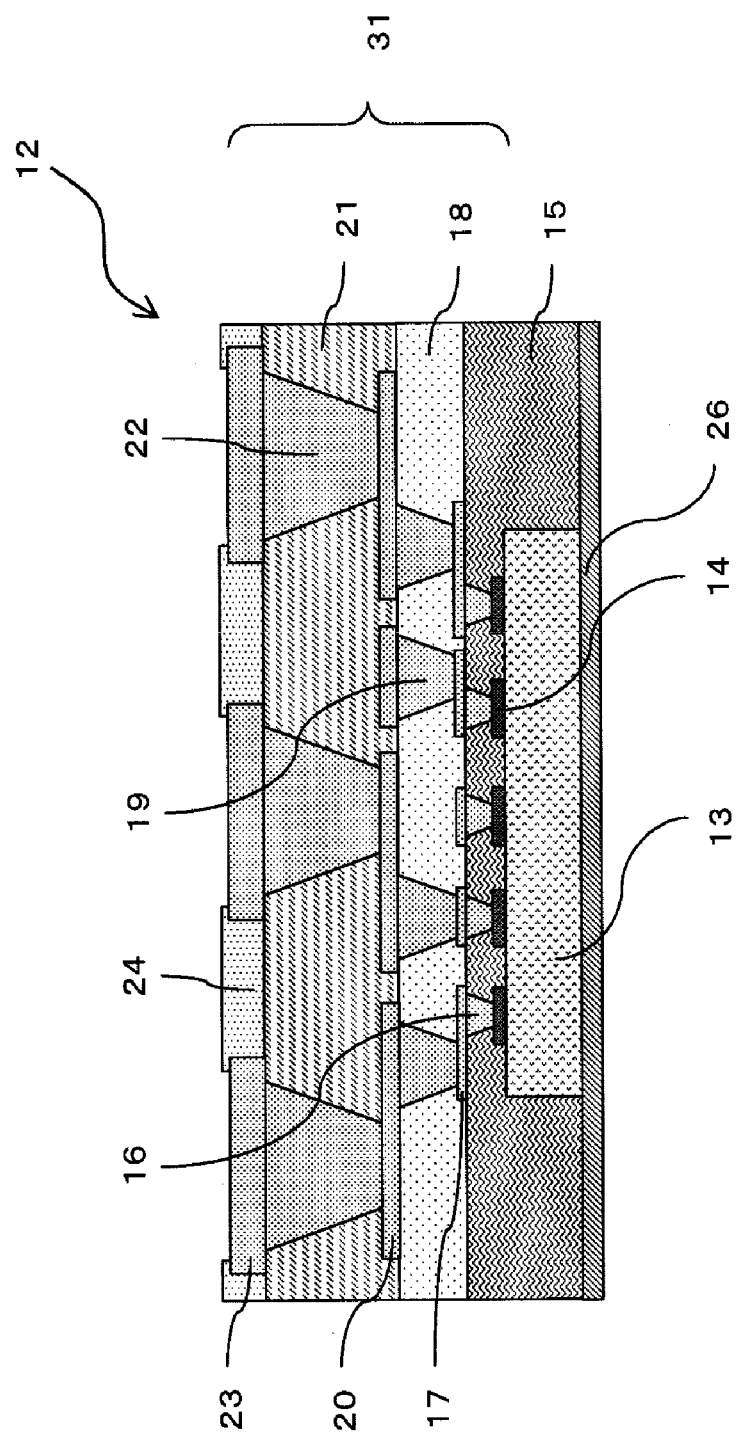
FIG. 3 is a cross-sectional view showing a semiconductor device according to a modification 5 of the exemplary embodiment 1.

An adhesive layer 26 may be provided on the surface of the semiconductor element 13 opposite to its surface carrying the electrode terminals 14. In this case, the adhesive layer 26 operates for preventing contamination of the semiconductor element 13. The adhesive layer 26 may be provided not only on the surface of the semiconductor element 13 carrying the electrode terminals 14, but in contact with the insulation layer A (15), as shown in FIG. 3.

In addition, a capacitor that performs the role of a noise filter for the circuit may be provided at a desired position on each layer. Examples of a dielectric material that composes the capacitor may include metal oxides, such as titanium oxide, tantalum oxide, $Al_2O_3$, $SiO_2$, $ZrO_2$, $HfO_2$ or $Nb_2O_3$, perovskite based materials, such as BST ($Ba_xSr_{1-x}TiO_3$), PZT ($PbZr_xTi_{1-x}O_3$) or PLZT ($Pb_{1-y}La_yZr_xTi_{1-x}O_3$), and Bi based laminar compounds, such as $SrBi_2Ta_2O_9$, where $0 \leq x \leq 1$ and $0 < y < 1$. An organic material mixed with an inorganic material or a magnetic material may also be used as a dielectric material that composes the capacitor. A discrete member other than the semiconductor element and the capacitor may be provided.

With the present exemplary embodiment or with its modifications, it is possible to improve the yield and reliability of the semiconductor element enclosing substrate in the manufacture of a multilevel substrate having enclosed therein the semiconductor elements of a narrow pitch and a multi-pin formulation.

[Exemplary Embodiment 2]

Figure 4:
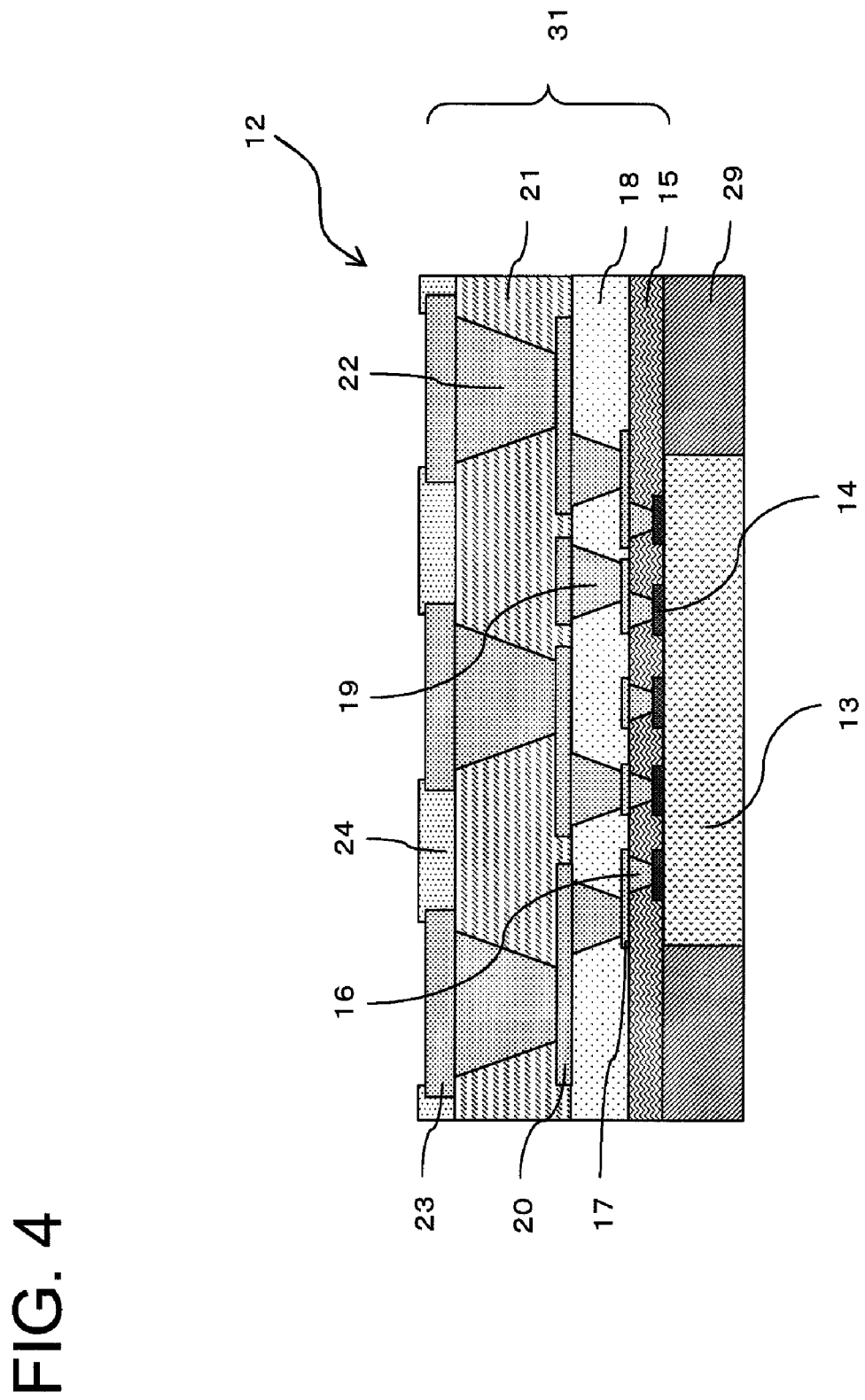
FIG. 4 is a cross-sectional view showing a semiconductor device according to an exemplary embodiment 2 of the present invention.

FIG. 4 depicts a cross-sectional view showing a semiconductor device according to an exemplary embodiment 2 of the present invention. In a semiconductor device 12 of FIG. 4, at least a part of a surface of the semiconductor element 13 carrying electrode terminals 14 is contacted with an insulation layer A (15), with the lateral side of the semiconductor element 13 being in contact with an insulation layer D (29). On top of the upper side of the electrode terminals 14, there are formed vias A (16), interconnects A (17), an insulation layer B (18), vias B (19), interconnects B (20), an insulation layer C (21) and vias C (22) to electrically interconnect the electrode terminals 14 and interconnects C (23). The interconnects C (23) also operate as external connection terminals for the semiconductor device 12. The solder resist 24 is provided in openings formed in a part of the interconnects C (23). The surface of the semiconductor element 13 opposite to its surface carrying the electrode terminals 14 is exposed from the insulation layer D (29).

In FIG. 4, there are shown three layers. However, this is not restrictive, such that any desired number of the layers may be used. In the present exemplary embodiment, three each of the interconnects and insulation layers are used.

In FIG. 4, the via cross-sectional shapes are increased in a sequence of the vias A (16), vias B (19) and the vias C (22), whilst the cross-sectional shapes of the interconnects are increased in a sequence of the interconnects A (17), interconnects B (20) and the interconnects C (23). The insulation layer A (15), insulation layer B (18) and the insulation layer C (21) between the electrode terminals 14 and the interconnect A (17) are increased in this sequence in thickness. It should be noted however that this formulation is not restrictive and is given only for illustration, as noted in connection with the exemplary embodiment 1.

The cross-sectional shape of the via denote the via top and bottom diameters and the via height. It is to be understood that the via cross-sectional shape is increased when at least one of these parameters is increased. A via top means a side of the via with a larger via diameter, and a via bottom means a side of the via with a lesser via diameter. Preferably, the via bottom side is to be the site of connection to the narrow-pitch semiconductor element. It is preferred, in light of the signal quality, that the via cross-sectional shapes are increased from one layer to the next from the layer closest to the semiconductor element while the via cross-sectional shapes remain similar to one another from one layer to the next.

The cross-sectional shapes of the interconnects denote the minimum line width as well as the minimum pitch between neighboring interconnects, viz., the interconnect design rule, and the thicknesses of the interconnects. It is sufficient that only one of these dimensions is increased. When it is stated that the cross-sectional shapes of the interconnects are increased, it indicates that, as regards the interconnect design rule, the pitch and the line width undergo transitions from the narrow pitch and the narrow line width towards the more relaxed pitch and line width and, as regards the thickness of the interconnect, the thickness undergoes transitions from the thin thickness to thick thickness. Preferably, the cross-sectional shapes of the interconnects are progressively increased beginning from the layer proximate to the semiconductor element.

To implement a semiconductor device at a high yield, it is desirable that cross-sectional shapes of the vias and those of the interconnects are increased progressively beginning from the layer proximate to the semiconductor element, and that the thicknesses of the insulation layers are concomitantly increased progressively. Viz., it is preferred that the interconnect design rule preferably undergoes transitions from the narrow pitch and the narrow line width to the more relaxed pitch and line width, while it is also preferred that the via diameter undergoes transitions from a smaller diameter to a larger diameter and that the thickness of the insulation layer undergoes transitions from a smaller thickness to a larger thickness. However, this is not to be construed restrictively.

With the interconnect design rule transitioning from the narrow pitch and the narrow line width to the more relaxed pitch and line width, the via diameter transitioning from the smaller to larger diameter and with the insulation layer thickness transitioning from a smaller to a larger thickness, the semiconductor device 12 may be improved in reliability.

Figure 2:
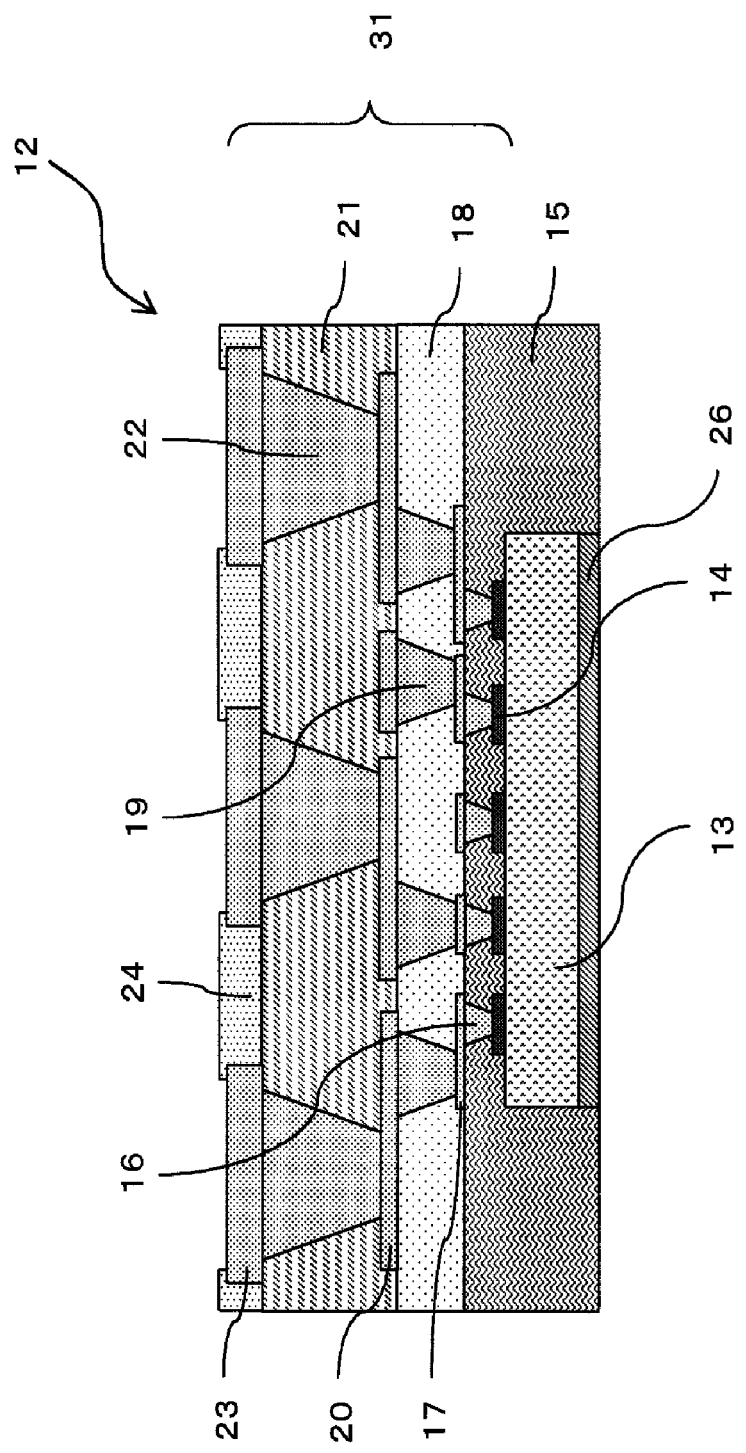
FIG. 2 is a cross-sectional view showing a semiconductor device according to a modification 4 of the exemplary embodiment 1.

An adhesive layer 26 may be provided on a surface of the semiconductor element 13 opposite to its surface carrying the electrode terminals 14, as shown in FIG. 2. In this case, the adhesive layer 26 operates for preventing the semiconductor element 13 from contamination. The adhesive layer may also be contacted not only with the side of the semiconductor element 13 opposite to its side carrying the electrode terminals 14, but also with an insulation layer D (29) (see FIG. 3).

The semiconductor element 13 may have its thickness adjusted depending on the thickness of the semiconductor device of interest. In the present exemplary embodiment, the thickness of the semiconductor element 13 was set to 30 to 50 µm. In FIG. 4, the number of the semiconductor elements may be one or more. The surface of the semiconductor element 13 opposite to its surface carrying the electrode terminals 14, referred to below as a back surface of the semiconductor element 13, is flush with the insulation layer D (29). On this back surface, a heat sink or the like member may be mounted in stability to high accuracy. On the other hand, if the back surface of the semiconductor element 13 is protruded from the insulation layer D (29), the exposed surface of the semiconductor element 13 is increased in area, thus improving heat radiation characteristic. The protruded portion may be worked to adjust the thickness of the semiconductor element 13. Further, if the back surface of the semiconductor element is recessed from the insulation layer D (29), it is possible to suppress chips from being produced from the edge of the semiconductor element 13. In the present exemplary embodiment, the back surface of the semiconductor element 13 is flush with the insulation layer D (29).

The insulation layer A (15), insulation layer B (18), insulation layer C (21) and the insulation layer D (29) are formed of a photo-sensitive or non-photo-sensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole) and a polynorbornene resin. Such materials as glass cloths, woven or non-woven cloths formed by aramide fibers impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin may also be used.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or Varilene, may also be used as the material for the insulation layers.

To implement a high yield semiconductor device, it is desirable to use a photosensitive resin for an insulation resin proximate to the semiconductor element for which the via diameter of the minutest size, minutest interconnect design rule and the thin insulation layers are requirements. It is also desirable to use, for the next following layer, a non-photosensitive resin, in which a via is formed by UV-YAG laser. For the insulation layer proximate to the external connection terminal, for which the maximum via diameter, the most relaxed interconnect design rule and a insulation layer with a thicker thickness are allowed, it is desirable to use a non-photosensitive resin, such as glass cloth, impregnated with reinforcement agents, may be used. It is necessary that the non-photo-sensitive resin is such material as to allow for forming a via therein using a $CO_2$ laser, By using an insulation material or a process, suited as to the interconnect design rule, cross-sectional shapes of vias or the insulation layer thicknesses, as required for the respective layers, the high yield desired may be obtained at lower costs.

A variety of meritorious effects may be expected by using variable insulation materials for the different layers. For example, an insulation material of low elasticity may be used for layers in need of miniscule vias, such as to improve the reliability. An insulation material of high elasticity may be used for a thicker insulation layer to reduce the warping in the semiconductor device.

Figure 5:
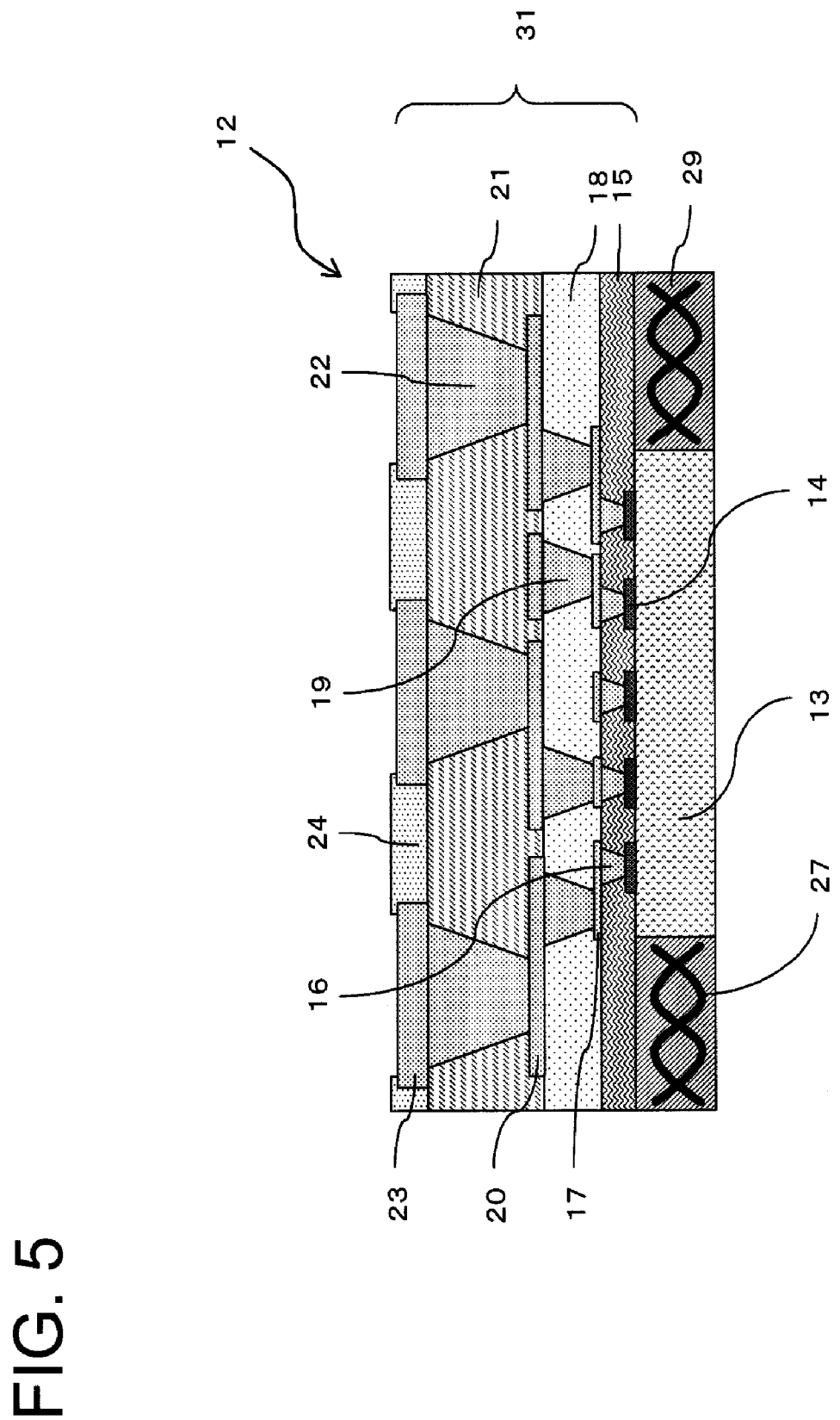
FIG. 5 is a cross-sectional view showing a semiconductor device according to a modification 1 of the exemplary embodiment 2.

In the present exemplary embodiment, an epoxy resin, a non-photo-sensitive resin, was used for the insulation layer A (15), insulation layer B (18) and for the insulation layer (21), as shown in FIG. 5. An epoxy resin, a non-photo-sensitive resin, including a glass cloth, was used as the insulation layer D (29). By using a resin exhibiting toughness, on an outer side of the semiconductor element 13, it is possible to prevent warping of the semiconductor device 12

For the interconnects A (17), B (20) and C (23), at least one metal selected from the group consisting of copper, silver, gold, nickel, aluminum and palladium, or an alloy containing the above metal(s) as main component, was used. From the perspective of the values of the electrical resistance and cost, it is preferred to use copper. In the present exemplary embodiment, copper was used for the interconnects A(17), B(20) and C(23).

For the via A (16), B (19) and C (22), at least one metal selected from the group consisting of copper, silver, gold, nickel, aluminum and palladium, or an alloy containing the above metal(s) as main component, may be used. From the perspective of the values of the electrical resistance and cost, it is preferred to use copper. In the present exemplary embodiment, copper is used for the vias A (16), B (19) and C (22).

A solder resist 24 is formed on the upper most surface of the semiconductor element 12 in such a manner that part of the interconnect C (23) as the outer electrode is exposed and the remaining unexposed portion will be covered by the solder resist. In the present exemplary embodiment, a photoresist ink was used as the material of the solder resist 24. The surface opened from the solder resist may be formed of at least one metal or alloy selected from the group consisting of gold, silver, copper, tin and a solder material. In the present exemplary embodiment, nickel and gold were deposited to thicknesses of 3 μm and 0.5 μm, in this order, respectively.

In addition, a capacitor that performs the role of a noise filter for the circuit may be provided at a desired position on each layer. Examples of a dielectric material that composes the capacitor may include metal oxides, such as titanium oxide, tantalum oxide, $Al_2O_3$, $SiO_2$, $ZrO_2$, $HfO_2$ or $Nb_2O_3$, perovskite based materials, such as BST ($Ba_xSr_{1-x}TiO_3$), PZT ($PbZr_xTi_{1-x}O_3$) or PLZT ($Pb_{1-y}La_yZr_xTi_{1-x}O_3$), and Bi based laminar compounds, such as $SrBi_2Ta_2O_9$, where $0 \leq x \leq 1$ and $0 < y < 1$. An organic material mixed with an inorganic material or a magnetic material may also be used as a dielectric material that composes the capacitor. A discrete member other than the semiconductor element and the capacitor may be provided.

With the present exemplary embodiment or with its modifications, it is possible to improve the yield and reliability of the semiconductor element enclosing substrate in the manufacture of a semiconductor element enclosing multilevel substrate of a narrow pitch and multi-pin formulation. By using different insulating materials for the side of the semiconductor element 13 carrying the electrode terminals 14 and for its lateral side and, in particular, by using an insulating material of high toughness for the lateral side, it is possible to improve low warping performance of the semiconductor device 12.

[Exemplary Embodiment 3]

FIG. 6 depicts a cross-sectional view showing a semiconductor device according to an exemplary embodiment 3 of the present invention. In the semiconductor device 12 of FIG. 6, the lateral surface of the semiconductor element 13 and at least a part of its surface carrying the electrode terminals 14 are contacted with the insulation layer A (15). On top of the upper surface of the electrode terminals 14, metal posts 30, interconnects A (17), vias B (19), interconnects B (20), an insulation layer C (21) and vias C (22) are provided for electrically interconnecting the electrode terminals 14 and the interconnects C (23) operating as external connection terminals for the semiconductor device 12. A solder resist 24 is provided as part of the interconnect C (23) is exposed. The surface of the semiconductor element 13 opposite to its surface carrying the electrode terminals 14 is exposed from the insulation layer A (15).

In FIG. 6, the number of the layers is three, only by way of illustration, such that any desired plural number of the layers may be used. In the present exemplary embodiment, there are provided three interconnect layers and three insulation layers. The total of the vias may be formed as metal posts 30.

In FIG. 6, the cross-sectional shapes of the vias and the post are increased in a sequence of the metal posts 30, vias B (19) and the vias C (22), while the cross-sectional shapes of the interconnects are increased in a sequence of the interconnects A (17), B (20) and C (23). In addition, the thicknesses of the insulation layers are increased in a sequence of the insulation layer A (15) between the electrode terminals 14 and the interconnects A (17), insulation layer B (18) and the insulation layer C (21). It should be noted that such formulation is not to be restrictive, as set out in connection with the description of the exemplary embodiment 1, The cross-sectional shapes of the vias denote the via top and bottom diameters and the via height. When it is stated that the cross-sectional shapes of the vias are increased, it is only sufficient that only one of the above dimensions are enlarged. The side of the via with a larger diameter is the via top, whereas that with a smaller diameter is the via bottom. It is preferred that the via bottom side is to be a site of connection to a narrow pitch via carrying side of the semiconductor element. It is also preferred, inter alia, that the cross-sectional shapes of the vias are increased beginning from the layer proximate to the semiconductor element as the similar shapes of the vias are maintained.

The cross-sectional shapes of the interconnects mean the minimum line width and the minimum pitch between neighboring interconnects, viz., the so-called interconnect design rule, and the thicknesses of the interconnects. It is sufficient that only one of these dimensions is increased. When it is stated that the cross-sectional shapes of the interconnects are increased, in indicates that, insofar as the interconnect design rule is concerned, the pitch and the line width undergo transitions from the narrow pitch and line width to more relaxed pitch and line width and, insofar as the interconnect thickness is concerned, it undergoes transitions from a thin thickness to thicker thickness. Preferably, the cross-sectional shapes of the interconnects are progressively increased beginning from the layer closest to the semiconductor element.

To implement a semiconductor device with a high yield, it is desirable that the cross-sectional shapes of the vias and the interconnects are progressively increased beginning from the layer proximate to the semiconductor element 13, with the insulation layers becoming concomitantly thicker in thickness. Viz., beginning from the layer proximate to the semiconductor element, the interconnect design rule preferably transitions from the narrow pitch and line width to more relaxed pitch and line width, with the via diameter undergoing transitions from a smaller value to a larger value and with the insulation layer thickness transitioning from a smaller value to a larger value. However, this is not to be construed as being restrictive.

With the interconnect design rule transitioning from the narrow pitch and line width to a more relaxed pitch and line width, with the via diameter transitioning from a smaller value to a larger value and with the insulation layer transitioning from a thinner thickness to a thicker thickness, the semiconductor device 12 may be improved in reliability.

As in the exemplary embodiment 1, an adhesive layer 26 may be provided on a surface of the semiconductor element 13 opposite to its surface carrying the electrode terminals 14, as shown in FIG. 2. In this case, the adhesive layer 26 operates for preventing the semiconductor element 13 from contamination. The adhesive layer may be contacted not only with the side of the semiconductor element 13 opposite to its side carrying the electrode terminals 14, but also with an insulation layer A (15) (see FIG. 3).

The semiconductor element 13 may have its thickness adjusted depending on the thickness of the semiconductor device of interest. In the present exemplary embodiment, the thickness of the semiconductor element 13 was set to 30 to 50 µm. In FIG. 6, the number of the semiconductor elements may be one or more. The surface of the semiconductor element 13 opposite to its surface carrying the electrode terminals 14, referred to below as a back surface of the semiconductor element 13, is flush with the insulation layer A (15). On this back surface, a heat sink or the like member may be mounted in stability to high accuracy. On the other hand, if the back surface of the semiconductor element 13 is protruded from the insulation layer A (15), the exposed surface of the semiconductor element 13 is increased in area, thus improving heat radiation characteristic. The protruded portion may be worked to adjust the thickness of the semiconductor element 13. Further, if the back surface of the semiconductor element 13 is recessed from the insulation layer A (15), it is possible to suppress chips from being produced from the edge of the semiconductor element 13. In the present exemplary embodiment, the back surface of the semiconductor element 13 is flush with the insulation layer A (15).

The insulation layer A (15), insulation layer B (18) and the insulation layer C (21) are formed of a photo-sensitive or non-photo-sensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole) and a polynorbornene resin. Such materials as glass cloths, woven or non-woven cloths formed by aramide fibers impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin may also be used.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or Varilene, may also be used as the material for the insulation layers.

To implement a high yield semiconductor device, it is desirable to use a photosensitive resin for an insulation resin proximate to the semiconductor element for which the via diameter of the minutest size, minutest interconnect design rule and the thin insulation layers are requirements. It is also desirable to use, for the next following layer, a non-photosensitive resin, in which a via may be formed by UV-YAG laser. For the insulation layer proximate to the external connection terminal, for which the maximum via diameter, the most relaxed interconnect design rule and a insulation layer with a thicker thickness are allowed, it is desirable to use a non-photo-sensitive resin, such as glass cloth, impregnated with reinforcement agents, may be used. It is necessary that the non-photo-sensitive resin is such a resin material as allows for forming a via therein using a $CO_2$ laser, By using an insulation material or a process, suited as to the interconnect design rule, cross-sectional shapes of vias or the insulation layer thicknesses, as required for the respective layers, the high yield desired may be obtained at lower costs.

A variety of meritorious effects may be expected by using variable insulation materials for the different layers. For example, an insulation material of low elasticity may be used for layers in need of miniscule vias, such as to improve the reliability. An insulation material of high elasticity may be used for a thicker insulation layer to reduce warping in the semiconductor device.

In the present exemplary embodiment, an epoxy resin, a non-photo-sensitive resin, was used as a material for the insulation layers A (15), B (18) and C (21). The insulation material for the side of the semiconductor element 13 for the electrode terminals 14 may differ from that for the lateral side of the semiconductor element 13, as shown in FIGS. 4 and 5. In such case, an insulation material for the lateral side of the semiconductor element 13 may be an insulation material of high toughness to improve the low warping performance of the semiconductor device 12.

For the interconnects A (17), B (20) and C (23), at least one metal selected from the group consisting of copper, silver, gold, nickel, aluminum and palladium, or an alloy containing the above metal(s) as main component, is used. From the perspective of the values of the electrical resistance and cost, it is preferred to use copper. In the present exemplary embodiment, copper is used for the interconnects A(17), B(20) and C(23).

For the via B (19) and C (22), at least one metal selected from the group consisting of copper, silver, gold, nickel, aluminum and palladium, or an alloy containing the above metal(s) as main component, is used. In particular, from the perspective of the values of the electrical resistance and cost, it is preferred to use copper. In the present exemplary embodiment, copper is used for the vias B (19) and C (22).

For the metal post 30, at least one metal selected from the group consisting of copper, silver, gold, nickel, aluminum and palladium, or an alloy containing the above metal(s) as main component, is used. In particular, from the perspective of the values of the electrical resistance and cost, it is preferred to use copper. In the present exemplary embodiment, copper is used. By electrically interconnecting the electrode terminals 14 of the semiconductor element 13 and the external connection terminal with the metal post 30, it becomes unnecessary to use the via (16). Since the via A (16) in general is of a small diameter, failures in connection in the via or deterioration in the yield is likely to be produced. By using the metal post as the via, it is possible to implement a high yield semiconductor device 12

A solder resist 24 is formed on the upper most surface of the semiconductor element 13 by partially exposing the surface of the interconnects C (23) as the external electrodes, with the remaining portion of the external electrode being covered by the resist. In the present exemplary embodiment, a photoresist ink was used as the material of the solder resist 24. At least one metal or alloy, selected from the group consisting of gold, silver, copper, tin and a solder material may be deposited on the surface exposed for the solder resist 24. In the present exemplary embodiment, nickel and gold were deposited in this order to a thickness of 3 μm and to a thickness of 0.5 μm, respectively.

A capacitor that performs the role of a noise filter for the circuit may be provided at a desired position on each layer. Examples of a dielectric material that composes the capacitor may include metal oxides, such as titanium oxide, tantalum oxide, $Al_2O_3$, $SiO_2$, $ZrO_2$, $HfO_2$ or $Nb_2O_3$, perovskite based materials, such as BST ($Ba_xSr_{1-x}TiO_3$), PZT ($PbZr_xTi_{1-x}O_3$) or PLZT ($Pb_{1-y}La_yZr_xTi_{1-x}O_3$), and Bi based laminar compounds, such as $SrBi_2Ta_2O_9$, where $0 \leq x \leq 1$ and $0 < y < 1$. An organic material mixed with an inorganic material or a magnetic material may also be used as a dielectric material that composes the capacitor. A discrete member may be provided in place of the semiconductor element or the capacitor.

With the present exemplary embodiment, it is possible to improve the yield and reliability of the semiconductor element enclosing substrate in the manufacture of a narrow-pitch multi-pin semiconductor element enclosing multilevel substrate. By using the metal posts 30, provided on the electrode terminals 14 of the semiconductor element 13, as the vias for interconnecting the electrode terminals 14 and the external connection terminals, it becomes unnecessary to open a small-sized vias after providing the insulation layer. Hence, there is no fear of the failures in electrical connection or deterioration in the yield, thus implementing a semiconductor device 12 of high reliability and yield.

[Exemplary Embodiment 4]

FIG. 7 depicts a cross-sectional view showing a semiconductor device according to an exemplary embodiment 4 of the present invention. In the semiconductor device 12 of FIG. 7, the lateral surface of a semiconductor element 13 and at least part of its surface carrying the electrode terminals 14 are in contact with an insulation layer A (15). On top of the electrode terminals 14, there are provided vias A (16), interconnects A (17), an insulation layer B (18), vias B (19), interconnects B (20), an insulation layer C (21) and vias C (22) for electrically interconnecting the electrode terminals 14 and the interconnect C (23). The interconnect C (23) operates as an external connection terminal for the semiconductor device 12. A solder resist 24 is provided as part of the interconnects C (23) is exposed. A support 25 is provided on a surface of the semiconductor element 13 opposite to its surface carrying the electrode terminals 14. In FIG. 7, the number of the layers is three. This is not to be construed to be restrictive, such that any suitable plural number of layers may be used. In the present exemplary embodiment, there are three interconnect layers and three insulation layers.

In FIG. 7, the cross-sectional shapes of the vias are increased in a sequence of the vias A (16), B (19) and C (22), whereas the cross-sectional shapes of the interconnects are increased in a sequence of the interconnects A (17), B (20) and C (23). The thicknesses of the insulation layers are increased in a sequence of the insulation layers A (15), B (18) and C (21). It should be noted however that such formulation is not restrictive, as set out in connection with the explanation of the exemplary embodiment 1.

The cross-sectional shapes of the vias denote the via top and bottom diameters and the via heights. It is to be understood that the via cross-sectional shapes are increased when at least one of these parameters are increased. A via top means a side of the via with a larger via diameter, and a via bottom means a side of the via with a lesser via diameter. Preferably, the via bottom side is to be the site of connection of the via to the narrow-pitch semiconductor element. It is preferred, in light of the signal quality, that the via cross-sectional shapes are increased from one layer to the next beginning from the layer closest to the semiconductor element as the via cross-sectional shapes remain similar to one another from one layer to the next.

The cross-sectional shapes of the interconnects denote the minimum line widths as well as the minimum pitch between neighboring interconnects, viz., the interconnect design rule, and the thicknesses of the interconnects. It is sufficient that only one of these dimensions is increased. When it is stated that the cross-sectional shapes of the interconnects are increased, it indicates that, as regards the interconnect design rule, the pitch and the line width undergo transitions from the narrow pitch and the narrow line width towards the more relaxed pitch and line width and, as regards the thickness of the interconnect, the thickness undergoes transitions from the thin thickness to thick thickness. Preferably, the cross-sectional shapes of the interconnects are progressively increased beginning from the layer proximate to the semiconductor element.

To implement a semiconductor device at a high yield, it is desirable that cross-sectional shapes of the vias and the interconnects are increased progressively beginning from the layer proximate to the semiconductor element and the thicknesses of the insulation layers are concomitantly increased progressively. Viz., it is preferred that the interconnect design rule preferably undergoes transitions from the narrow pitch and the narrow line width to the more relaxed pitch and line width, the via diameter undergoes transitions from a smaller diameter to a larger diameter and the thickness of the insulation layer undergoes transitions from the smaller thickness to a larger diameter. However, this is not to be construed restrictively.

As regards the interconnect design rule, the pitch and the line width undergo transitions from the narrow pitch and line width to more relaxed pitch and line width. On the other hand, the via diameter undergoes transitions from the smaller diameter to the larger diameter, whilst the thickness of the insulation layer undergoes transitions from a thinner thickness to a thicker thickness. Hence, the semiconductor device 12 may be improved in reliability.

An adhesive layer 26 is provided on the surface of the semiconductor element 13 opposite to its surface carrying the electrode terminals 14. The adhesive layer 26 may, however, be provided in contact with the insulation layer A (15) in addition to on the surface of the semiconductor element 13 opposite to its surface carrying the electrode terminals 14.

The semiconductor element 13 may have its thickness adjusted in keeping with the target thickness of the semiconductor device. In the present exemplary embodiment, the thickness of the semiconductor element 13 is set in a range of from 30 to 50 μm. In FIG. 7, the number of the semiconductor elements 13 may be one or any suitable plural number. The surface of the semiconductor element 13 opposite to its surface carrying the electrode terminals 14, referred to below as back surface of the semiconductor element 13, is flush with the insulation layer A (15). Hence, a heat sink or the like member may be mounted on this opposite sure in stability to high accuracy. On the other hand, in case the back side of the semiconductor element 13 is protruded from the level of the insulation layer A (15), an exposed surface of the semiconductor element 13 is increased, thus improving a heat radiation characteristic. The thickness of the protruded portion of the semiconductor element may also be adjusted by polishing. In case the back surface of the semiconductor element 13 is recessed from the insulation layer A (15), it becomes possible to prevent chips produced at an edge of the semiconductor element 13. In the present exemplary embodiment, the back surface of the semiconductor element 13 is flush with the insulation layer A (15).

The insulation layer A (15), insulation layer B (18) and the insulation layer C (21) are formed of a photo-sensitive or non-photo-sensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole), and a polynorbornene resin. It is also possible to use, as the organic materials, glass cloths and woven or non-woven cloths formed by aramide fibers. These materials are impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin, and are used in this state.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or Varilene, may also be used as the material for the insulation layers.

To implement a high yield semiconductor device, it is desirable to use a photosensitive resin for an insulation resin proximate to the semiconductor element for which the via diameter of the minutest size, minutest interconnect design rule and the thin insulation layers are requirements. It is also desirable to use, for the next following layer, a non-photo-sensitive resin, in which a via is formed by UV-YAG laser. For the insulation layer proximate to the external connection terminal, for which the maximum via diameter, the most relaxed interconnect design rule and a insulation layer with a thicker thickness are allowed, it is desirable to use a non-photo-sensitive resin, such as glass cloth, impregnated with reinforcement agents. It is necessary that the non-photo-sensitive resin is such a resin material as allows for forming a via therein using a $CO_2$ laser, By using an insulation material or a process, suited as to the interconnect design rule, cross-sectional shapes of vias or the insulation layer thicknesses, as required for the respective layers, the high yield desired may be obtained at lower costs.

A variety of meritorious effects may be expected by using variable insulation materials for the different layers. For example, an insulation material of low elasticity may be used for layers in need of miniscule vias, such as to improve the reliability. An insulation material of high elasticity may be used for a thicker insulation layer to reduce warping in the semiconductor device.

In the present exemplary embodiment, an epoxy resin, a non-photo-sensitive resin, was used as a material for the insulation layers A (15), B (18) and C (21).

For the interconnect A (17), interconnect B (20) and for the interconnect C (23), at least one metal selected from the group consisting of, for example, copper, silver, gold, nickel, aluminum and palladium, or an alloy mainly composed of such metal(s), is used. It is preferred to use copper in light of the value of electrical resistance and cost. In the present exemplary embodiment, copper is used for the interconnect A (17), interconnect B (20) and the interconnect C (23).

For the via A (16), via B (19) and for the via C (22), at least one metal selected from the group consisting of, for example, copper, silver, gold, nickel, aluminum and palladium, or an alloy mainly composed of such metal(s), may be used. It is preferred to use copper in light of the value of electrical resistance and cost. In the present exemplary embodiment, copper is used for the via A (16), via B (19) and for the via C (22).

A solder resist 24 is formed on the upper most surface of the semiconductor element 13 by partially exposing the surface of the interconnect C (23) as the external electrode. The remaining portion of the external electrode was covered by the resist. In the present exemplary embodiment, a photoresist ink was used as the material of the solder resist 24. At least one metal, selected from the group consisting of gold, silver, copper, tin and a solder material, or an alloy thereof, may be deposited on the surface exposed for the solder resist 24. In the present exemplary embodiment, nickel and gold were deposited in this order to a thickness of 3 μm and to a thickness of 0.5 μm, respectively.

Figure 9:
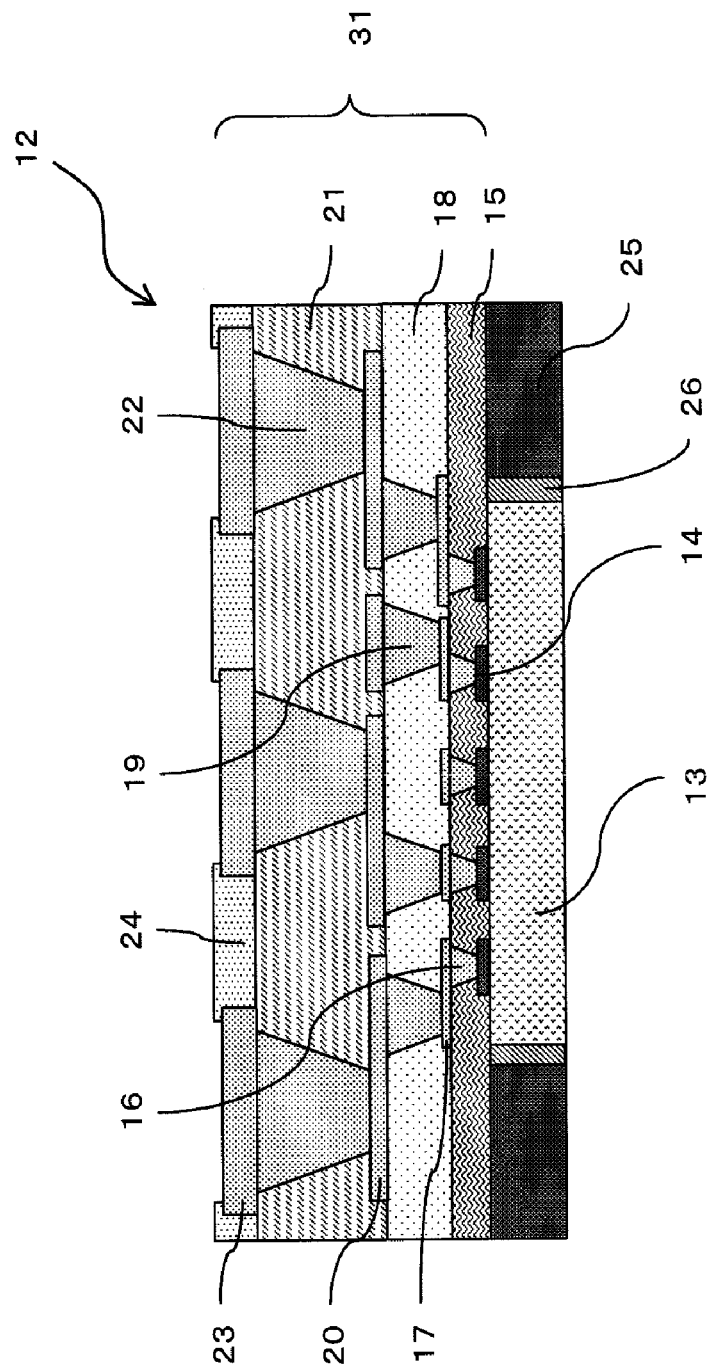
FIG. 9 is a cross-sectional view showing a semiconductor device according to a modification 2 of the exemplary embodiment 4.

The support 25 may be formed of such material as resin, metal, glass or silicon, either alone or in combination. The site of the support 25 where the semiconductor element 13 is mounted may be in the form of a recess (FIG. 8) or in the form of a slit (FIG. 9). In this case, there is no necessity to supply the lateral surface of the semiconductor element 13 with an insulation material, so that it becomes possible to suppress the warping of the semiconductor device otherwise produced due to the difference between the linear expansion coefficient of the insulation material and that of the support 25. In addition, the semiconductor device may be reduced in height.

In FIG. 7, the support 25 is provided on the back surface of the semiconductor element 13 of the semiconductor device 12 shown in FIG. 2. However, the support 25 may also be provided on the back surface of the semiconductor element 13 of the semiconductor device 12 shown in any of FIGS. 1 to 6 for the exemplary embodiments 1 to 3.

A capacitor that performs the role of a noise filter for the circuit may be provided at a desired position on each layer. Examples of a dielectric material that composes the capacitor may include metal oxides, such as titanium oxide, tantalum oxide, $Al_2O_3$, $SiO_2$, $ZrO_2$, $HfO_2$ or $Nb_2O_3$, perovskite based materials, such as BST ($Ba_xSr_{1-x}TiO_3$), PZT ($PbZr_xTi_{1-x}O_3$) or PLZT ($Pb_{1-y}La_yZr_xTi_{1-x}O_3$), and Bi based laminar compounds, such as $SrBi_2Ta_2O_9$, where $0 \leq x \leq 1$ and $0 < y < 1$. An organic material mixed with an inorganic material or a magnetic material may also be used as a dielectric material that composes the capacitor. A discrete member may be provided in place of the semiconductor element or the capacitor.

With the present exemplary embodiment, it is possible to improve the yield and reliability of the semiconductor element enclosing substrate in the manufacture of a semiconductor element enclosing multilevel substrate of a narrow pitch and multi-pin formulation. By providing the support 25 in the semiconductor device 12, it becomes possible to reduce the warping of the semiconductor device 12 to improve reliability in secondary packaging evaluation.

A heat sink 28 may be provided on the back side of the semiconductor element 13 of the semiconductor device 12 shown in any of FIGS. 1 to 9 for the exemplary embodiments 1 to 4, as shown in FIG. 10. The semiconductor device 12 may be improved in heat radiation performance by providing the heat sink 28 thereon.

[Exemplary Embodiment 5]

FIGS. 11 and 12 show a manufacturing method for a semiconductor device according to an exemplary embodiment 5 of the present invention. (e) to (f) of FIG. 12 show the steps following the steps (a) to (d) of FIG. 11. The semiconductor device of the exemplary embodiment 1 (FIG. 2) may be manufactured by the manufacturing method of the present exemplary embodiment.

Initially, a support 25 is provided, as shown in (a) of FIG. 11. The support 25 may be formed of resin, metal, glass or silicon, either alone or in combination. Preferably, a position mark, used for loading the semiconductor element 13, is provided on the support 25. It is sufficient that the position mark may be recognized accurately to perform the role for indicating a loading position. It may be provided by precipitating metal on the support 25 or by forming a recess by wet etching or by machining processing. In the present exemplary embodiment, the support 25 is a steel plate 0.5 mm in thickness, whilst the position mark is formed by depositing nickel to a thickness of 5 μm by electroplating on the support 25.

The semiconductor element 13 is then mounted on the support 25, provided with the position mark, so that the electrode terminals 14 will form an upper surface, viz., assume a so-called face-up position, as shown in (b) of FIG. 11. In the present exemplary embodiment, the semiconductor element 13 is of a narrow-pitch multi-pin configuration, with the pad pitch of the semiconductor elements 13 enclosed being 20 to 150 μm and with the number of pins being 1000 to 2000.

The insulation layer A (15) is then deposited, so that the surface of the semiconductor element 13 carrying the electrode terminals 14 and its lateral side will be covered by the insulation layer simultaneously, as shown in (c) of FIG. 11. The insulation layer A (15) is formed by, for example, a photosensitive or a non-photo-sensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole), and a polynorbornene resin. It is also possible to use, as the organic materials, any of glass cloths and woven or non-woven cloths formed by aramide fibers. These materials are impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin, and are used in this state.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or varilene, may also be used as the material for the insulation layers.

The depositing method may be enumerated by transfer molding, compression molding, printing, vacuum press, vacuum lamination, spin coating, die coating and curtain coating. In the present exemplary embodiment, epoxy resin is formed by vacuum lamination.

Then, to establish electrical connection between the electrode terminals 14 on the semiconductor element 13 and the external connection terminal, vias A (16) and interconnects A (17) are formed, as shown in (d) of FIG. 11. Initially, an opening, which later becomes the via A (16), is opened in an insulation layer A (15). If the insulation layer A (15) is of a photo-sensitive material, the opening is formed by photolithography. If the insulation layer A (15) is of a non-photo-sensitive material, or of a photo-sensitive material which is low in pattern resolution, the opening is formed by laser working, dry etching or a blast method. In the present exemplary embodiment, the laser working is used. At least one metal, selected from the group consisting of copper, silver, gold, nickel, aluminum and palladium, or an alloy containing the metal(s) as main component, is charged into the opening to form the via A (16). For charging, an electroplating method, an electroless plating method, a printing method or a molten metal suction method may be used. Or, a post for current conduction may be formed in advance at a location which later becomes a via, an insulation layer may then be formed, and the surface of the insulation layer may then be removed by polishing to expose the post for current conduction to form the via.

The interconnect A (17) may be formed by a subtractive method, a semi-additive method or a full-additive method. In the subtractive method, a resist of a desired pattern is formed on a copper foil provided on a substrate. An unneeded portion of the copper foil is etched off and the resist is then peeled off to obtain a desired pattern. In the semi-additive method, a current supplying layer is formed by an electroless plating method, a sputtering method, or a CVD (chemical vapor deposition) method, and a resist having openings in accordance with a desired pattern is then deposited. Then, a metal is precipitated by electroplating in the resist openings. The resist is then removed and the current supplying layer is etched off to obtain the desired interconnect pattern. In the full-additive method, a catalyst for electroless plating is adsorbed on a substrate, and a pattern is formed by a resist. As the resist is left over as a catalyst layer, the catalyst is activated, and metal is precipitated in the opening in the insulation layer by electroless plating to obtain a desired interconnect pattern. For the interconnect A (17), at least one metal selected from the group of copper, silver, gold, nickel, aluminum and palladium, or an alloy containing the metal(s) as main component, may be used. In particular, copper is preferred in light of the value of the electrical resistance and cost.

The above mentioned steps of forming the insulation layers, interconnects and vias are repeated a number of times corresponding to the desired number of the layers. It is preferred that the cross-sectional shapes of the interconnects of the layers deposited, the cross-sectional shapes of the vias or the thicknesses of the insulation layers are increased progressively. It is also preferred that, in small diameter vias or layers in need of miniscule interconnects, a photo-via by ultraviolet light irradiation or a UV laser is used to form a via and the semi-additive method is used to form an interconnect. It is further preferred that, for a layer that may accommodate a larger diameter via or an interconnect of relaxed line width or pitch, it is preferred to use a $CO_2$ laser for forming a via and to use a subtractive method for forming an interconnect. The device or the method used or the insulation material is selected depending on variable cross-sectional shapes of the vias or of the interconnects or the thicknesses of the insulation layers to improve the yield by the multilevel configuration as well as to lower the cost. In the present exemplary embodiment, the number of the layers is set to three, as shown in (e) of FIG. 12. However, this is not restrictive and the number of the layers may be any plural number equal to or larger than two provided that the layers are provided towards the side of the electrode terminals of the semiconductor element 13.

In the present exemplary embodiment, the UV laser method and the semi-additive method are used for forming the vias and the interconnects for the layer closest to the semiconductor element (first layer). For the second layer and further layers, a $CO_2$ laser and the subtractive method are used. As regards the first layer via diameter, the top via diameter was 25 μm and the bottom via diameter was 15 μm, with the L/S being 10 μm/10 μm. As regards the second and further via diameters, the top via diameter was 80 μm, the bottom via diameter was 70 μm, with the L/S being 50 μm/50 μm. The insulation layer thickness was 20 μm and 50 μm for the first layer and for the second and further layers, respectively.

A pattern of the solder resist 24 is then formed on the interconnect C (23) of the upper most layer. The solder resist 24 is formed for protecting the surface circuitry and for assuring the combustion retardant performance of the semiconductor device 12. The solder resist may be formed of an organic material, such as epoxy-, acryl-, urethane- or polyimide-based material, which may be admixed with a filler of an inorganic or organic material as appropriate. The solder resist 24 does not have to be provided on the semiconductor device 12. The surface of the interconnect C (23), opened for the solder resist, may be formed of at least one metal selected from the group consisting of gold, silver, copper, tin and the solder material, and/or any alloys of the metal(s). In the present exemplary embodiment, nickel and gold were formed on the surface of the interconnect C (23) to thicknesses of 3 μm and 0.5 μm, respectively.

The support 25 is then removed, as shown in (f) of FIG. 12. The technique most proper for this case is the technique of providing a release layer on the support 25 at the outset. The support 25 may be removed by dry etching, wet etching or machining processing.

With the present exemplary embodiment, the semiconductor device 12, having enclosed therein a plurality of layers of the semiconductor elements of the narrow-pitch and multi-pin configuration, may be manufactured highly efficiently. With the semiconductor device 12, the cross-sectional shapes of the vias and the interconnects are increased, and the thicknesses of the insulation layers are increased, with increase in the number of the layers. Hence, proper devices and processes as well as proper insulation layer thicknesses are selected to implement a semiconductor device 12 of high reliability.

[Exemplary Embodiment 6]

FIGS. 13 and 14 show process steps showing the method for manufacturing a semiconductor device according to an exemplary embodiment 6 of the present invention. FIG. 14 shows, at (c) and (d), the process steps carried out following those shown at FIG. 13(a) and (b). The semiconductor device of the exemplary embodiment 2 (FIG. 5) may be manufactured by the manufacturing method of the present invention.

Initially, the support 25 is provided. The support 25 may be formed of resin, metal, glass or silicon, either singly or in combination. A position mark may preferably be mounted on the support 25 for ease in mounting the semiconductor element 13. It is sufficient that the position mark may be recognized accurately to perform the role as position indicia. It may be provided by precipitating metal on the support 25 or by forming a recess by wet etching or by machining processing. In the present exemplary embodiment, the support 25 is a copper plate 0.5 mm in thickness, whilst the position mark is formed by depositing nickel to a thickness of 5 μm by electroplating on the support 25.

The semiconductor element 13 is then mounted on the support 25, provided with the position mark, so that the electrode terminals 14 will form an upper surface, viz., assume a so-called face-up state, as shown in (a) of FIG. 13. In the present exemplary embodiment, the semiconductor element 13 is of the narrow-pitch multi-pin configuration, with the pad pitch of the semiconductor elements 13 enclosed being 60 μm and with the number of pins being 2500.

The semiconductor element 13 is then embedded in the insulation layer. In this case, the embedding process is divided into a process of embedding the lateral side of the semiconductor element 13 in the insulation layer and a process of embedding the upper side of the semiconductor element 13 carrying the electrode terminals 14 in the insulation layer. Initially, a film-shaped insulation layer D (29), in which an opening has been formed only at a location of the semiconductor element 13, is provided, as shown in (b) of FIG. 13. The insulation layer is preferably impregnated with a reinforcement agent 27 to impart toughness to the lateral surface of the semiconductor substrate 13.

The insulation layer A (15) is provided on the upper surfaces of the electrode terminals 14 of the semiconductor element 13, as shown in (c) of FIG. 14.

The insulation layer A (15) and the insulation layer D (29) are formed by, for example, a photosensitive or a non-photosensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole), and a polynorbornene resin. It is also possible to use, as the organic materials, glass cloths and woven or non-woven cloths formed by aramide fibers. These materials are impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin, and are used in this state.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or Varilene, may also be used as the material for the insulation layers.

The depositing method may be enumerated by transfer molding, compression molding, printing, vacuum press, vacuum lamination, spin coating, die coating and curtain coating.

Since the insulation material is initially provided on the lateral surface of the semiconductor element 13, the insulation layer A (15), deposited on the upper surfaces of the electrode terminals 14 of the semiconductor element 13, may be in the form of a liquid instead of in the form of a film. By using a photo-sensitive liquid insulation material, it becomes possible to form a miniscule via to get the semiconductor elements 13 embedded with a narrow pad pitch.

In the present exemplary embodiment, a prepreg comprised of a glass cloth impregnated, presenting an opening only in register with the semiconductor element 13, was used as the insulation layer D (29). As the insulation layer A (15), the resin not containing a glass cloth was used. These layers were both deposited by vacuum lamination.

Then, to establish electrical connection between the electrode terminals 14 on the semiconductor element 13 and the external connection terminal, vias A (16) and interconnects A (17) are formed. Initially, an opening, which later becomes the via A (16), is opened in an insulation layer A (15). If the insulation layer A (15) is of a photo-sensitive material, the opening is formed by photolithography. If the insulation layer A (15) is of a non-photo-sensitive material, or of a photo-sensitive material which is low in pattern resolution, the opening is formed by laser working, dry etching or a blast method. In the present exemplary embodiment, the laser working is used. At least one metal, selected from the group consisting of copper, silver, gold, nickel, aluminum and palladium, or an alloy containing the metal(s) as main component, is charged into the opening to form the via A (16). For charging, an electroplating method, an electroless plating method, a printing method or a molten metal suction method may be used. Or, a post for current conduction may be formed in advance at a location which later becomes a via, an insulation layer may then be formed, and the surface of the insulation layer may then be removed by polishing to expose the post for current conduction to form the via.

The interconnect A (17) may be formed by a subtractive method, a semi-additive method or a full-additive method. In the subtractive method, a resist of a desired pattern is formed on a copper foil provided on a substrate. An unneeded portion of the copper foil is etched off and the resist is then peeled off to obtain a desired pattern. In the semi-additive method, a current supplying layer is formed by an electroless plating method, a sputtering method or a CVD (chemical vapor deposition) method, and a resist having openings in accordance with a desired pattern is then deposited. Then, a metal is precipitated by electroplating in the resist openings. The resist is then removed and the current supplying layer is etched off to obtain the desired interconnect pattern. In the full-additive method, a catalyst for electroless plating is adsorbed on a substrate, and a pattern is formed by a resist. As the resist is left over as a catalyst layer, the catalyst is activated, and metal is precipitated in the opening in the insulation layer by electroless plating to obtain a desired interconnect pattern. For the interconnect A (17), at least one metal selected from the group of copper, silver, gold, nickel, aluminum and palladium, or an alloy containing the metal(s) as main component, is used. In particular, copper is preferred in light of the value of the electrical resistance and cost.

The above mentioned steps of forming the insulation layers, interconnects and vias are repeated a number of times corresponding to the desired number of the layers. It is preferred that the cross-sectional shapes of the interconnects of the layers deposited, the cross-sectional shapes of the vias or the thicknesses of the insulation layers are increased progressively. It is also preferred that, in small diameter vias or layers in need of miniscule interconnects, a photo-via by ultraviolet light irradiation or a UV laser is used for forming a via, and that the semi-additive method is used for forming an interconnect. For a layer that may accommodate a larger diameter via or an interconnect of relaxed line width or pitch, it is preferred to use a $CO_2$ laser for forming a via and to use a subtractive method for forming an interconnect. The device or the method used or the insulation material is selected depending on variable cross-sectional shapes of the vias or the interconnects or on the thicknesses of the insulation layers such as to improve the yield by multilevel configuration as well as to lower the cost. In the present exemplary embodiment, the number of the layers is set to three. However, this is not restrictive and the number of the layers may be any plural number equal to or larger than two provided that the layers are formed towards the side of the electrode terminals of the semiconductor element 13.

In the present exemplary embodiment, the UV laser method and the semi-additive method are used for forming the vias and the interconnects for the layer closest to the semiconductor element (first layer). For the second and further layers, a $CO_2$ laser and the subtractive method are used. As regards the first layer via diameter, the top via diameter was 25 μm, the bottom via diameter was 15 μm, with the L/S being 10 μm/10 μm. As regards the second and further via diameters, the top via diameter was 80 μm, the bottom via diameter was 70 μm, with the L/S being 50 μm/50 μm. The thicknesses of the first layer and the second and further layers were 20 μm and 50 μm, respectively.

A pattern of the solder resist 24 is then formed on the interconnect C (23) of the upper most layer. The solder resist 24 is formed for protecting the surface circuitry and assuring the combustion retardant performance of the semiconductor device 12. The solder resist may be formed of an organic material, such as epoxy-, acryl-, urethane- or polyimide-based material, which may be admixed with a filler of an inorganic or organic material as appropriate. The solder resist 24 does not have to be provided on the semiconductor device 12. The surface of the interconnect C (23), opened for the solder resist, may be formed of at least one metal selected from the group consisting of gold, silver, copper, tin and the solder material, and/or any alloys of the metal(s). In the present exemplary embodiment, nickel and gold were formed on the surface of the interconnect C (23) to thicknesses of 3 μm and 0.5 μm, respectively.

The support 25 is then removed. The technique most proper for this case is the technique of providing a release layer on the support 25 at the outset. The support 25 may be removed by dry etching, wet etching or machining processing.

With the present exemplary embodiment, the semiconductor device 12, having enclosed therein a plurality of layers of the semiconductor elements of the narrow-pitch multi-pin configuration may be manufactured highly efficiently. With the semiconductor device 12, the cross-sectional shapes of the vias and the interconnects are increased, and the thicknesses of the insulation layers are increased, with increase in the number of the layers. Hence, proper devices and processes as well as proper insulation layer thicknesses are selected to implement a semiconductor device 12 of high reliability. Moreover, by using variable or different insulation materials for the lateral and upper sides of the semiconductor element 13, specifically, by using a prepreg containing a reinforcement agent on the lateral side and by using an insulation material that allows for forming a miniscule interconnect on the upper surface side, it is possible to reduce the warping of the semiconductor device 12.

[Exemplary Embodiment 7]

FIGS. 15 and 16 show process steps showing the method for manufacturing a semiconductor device according to an exemplary embodiment 7 of the present invention. FIG. 16 shows, at (c) and (d), the process steps carried out following those shown at FIG. 15(*a*) and (*b*). The semiconductor device of the exemplary embodiment 3 (FIG. 6) may be manufactured by the manufacturing method of the present invention.

Initially, a support 25 is provided. The support 25 may be formed of resin, metal, glass or silicon, either singly or in combination. A position mark may preferably be formed on the support 25 for ease in mounting the semiconductor element 13. It is sufficient if the position mark may be recognized accurately to perform the role as position indicia. It may be provided by precipitating metal on the support 25 or by forming a recess by wet etching or by machining processing. In the present exemplary embodiment, the support 25 is a copper plate 0.5 mm in thickness, whilst the position mark is formed by depositing nickel to a thickness of 5 µm by electroplating on the support 25.

The semiconductor element 13 is then mounted on the support 25, carrying the position mark thereon, so that the electrode terminals 14 will form an upper surface, viz., assume a face-up state, as shown in (a) of FIG. 15. A plurality of metal posts 30 are provided on the semiconductor element 13. These metal posts 30 operate as vias in the subsequent process. In the present exemplary embodiment, the pad pitch of the semiconductor elements 13 enclosed is 60 µm, with the number of the pins being 2500. The metal post is a copper post, with its diameter and height being 50 µm and 15 µm, respectively.

An insulation layer A (15) is then deposited to cover the surface of the semiconductor element 13 carrying the electrode terminals 14 and its lateral surface simultaneously, as shown in (b) of FIG. 15. The insulation layer A (15) is formed by, for example, a photosensitive or a non-photo-sensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole), and a polynorbornene resin. It is also possible to use, as the organic materials, glass cloths and woven or non-woven cloths formed by aramide fibers. These materials are impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin, and are used in this state.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or varilene, may also be used as the material for the insulation layers.

The depositing method may be enumerated by transfer molding, compression molding, printing, vacuum press, vacuum lamination, spin coating, die coating and curtain coating. In the present exemplary embodiment, an epoxy resin is deposited by vacuum lamination.

The surface of the metal posts 30 on the semiconductor element 13 then is exposed from the insulation layer A (15), as shown in FIG. 16(*c*). For exposing the metal post surface in this manner, polishing, grinding, wet etching dry etching or buffing, for example, may be used. In the present exemplary embodiment, a grinder is used.

An interconnect A (17) is then formed to establish electrical connection between the metal post surface and the external connection terminal, as shown in (d) of FIG. 16.

By getting the surface of the metal post 30 thus exposed from the insulation layer A (15), it is possible to form a via, interconnecting the electrode terminal 14 and the interconnect A (17), without the necessity of providing a miniscule via of high position precision in the insulation layer A (15). In this manner, the process of getting the semiconductor elements 13 of narrow pad pitch enclosed in the insulation layer may be improved in yield and reliability.

The interconnect A (17) may be formed by a subtractive method, a semi-additive method or a full-additive method. In the subtractive method, a resist of a desired pattern is formed on a copper foil provided on a substrate. An unneeded portion of the copper foil is etched off and the resist is then peeled off to obtain a desired pattern. In the semi-additive method, a current supplying layer is formed by an electroless plating method, a sputtering method or a CVD (chemical vapor deposition) method, and a resist having openings in accordance with a desired pattern is then deposited. Then, a metal is precipitated by electroplating in the resist openings. The resist is then removed and the current supplying layer is etched off to obtain the desired interconnect pattern. In the full-additive method, a catalyst for electroless plating is adsorbed on a substrate, and a pattern is formed by a resist. As the resist is left over as a catalyst layer, the catalyst is activated, and metal is precipitated in the opening in the insulation layer by electroless plating to obtain a desired interconnect pattern. For the interconnect A (17), at least one metal selected from the group of copper, silver, gold, nickel, aluminum and palladium, or an alloy containing the metal(s) as main component, is used. In particular, copper is preferred in light of the value of the electrical resistance and cost.

The above mentioned steps of forming the insulation layers, interconnects and vias are repeated a number of times corresponding to the desired number of the layers. It is preferred that the cross-sectional shapes of the interconnects of the layers deposited, the cross-sectional shapes of the vias or the thicknesses of the insulation layers are increased progressively. It is also preferred that, in small diameter vias or layers in need of miniscule interconnects, a photo-via by ultraviolet light irradiation or a UV laser is used for forming the vias, and the semi-additive method is used for forming the interconnects. It is further preferred that, for a layer that may allow for a larger diameter via or an interconnect of relaxed line width or pitch, a $CO_2$ laser is used for forming a via, and a subtractive method is used for forming an interconnect. The device or the method used or the insulation material is selected depending on variable cross-sectional shapes of the vias or the interconnects or on the thicknesses of the insulation layers to improve the yield by the multilevel configuration as well as to lower the cost. In the present exemplary embodiment, the number of the layers is set to three, only by way of illustration. Viz., the number of the layers may be any plural number larger than two provided that the layers are provided towards the side of the electrode terminals of the semiconductor element 13.

In the present exemplary embodiment, the UV laser method and the semi-additive method are used for forming the vias and the interconnects for the layer closest to the semiconductor element (first layer). For the second layer and further layers, a $CO_2$ laser and the subtractive method are used. As regards the first layer via diameter, the top via diameter was 25 µm, the bottom via diameter was 15 µm, with the L/S being 10 µm/10 µm. As regards the second and further via diameters, the top via diameter was 80 µm, the bottom via diameter was 70 µm, with the L/S being 50 µm/50 µm. The insulation layer thickness was 20 µm and 50 µm for the first layer and for the second and further layers, respectively.

A pattern of the solder resist 24 is then formed on the interconnect C (23) of the upper most layer. The solder resist 24 is formed for protecting the surface circuitry and assuring the combustion retardant performance of the semiconductor device 12. The solder resist may be formed of an organic material, such as epoxy-, acryl-, urethane- or polyimide-based material, which may be admixed with a filler of an inorganic or organic material as appropriate. The solder resist 24 does not have to be provided on the semiconductor device 12. The surface of the interconnect C (23), opened for the solder resist, may be formed of at least one metal selected from the group consisting of gold, silver, copper, tin and the solder material, and an alloy of the metal(s). In the present exemplary embodiment, nickel and gold were formed on the surface of the interconnect C (23) to thicknesses of 3 μm and 0.5 μm, respectively.

The support 25 is then removed. The technique most proper for this case is the technique of providing a release layer on the support 25 at the outset. The support 25 may be removed by dry etching, wet etching or machining processing.

With the present exemplary embodiment, the semiconductor device 12, having enclosed therein a plurality of layers of the semiconductor elements of the narrow-pitch multi-pin configuration may be manufactured highly efficiently. With the semiconductor device 12, the cross-sectional shapes of the vias and the interconnects are increased, and the thicknesses of the insulation layers are increased, with increase in the number of the layers. Hence, proper devices and processes as well as proper insulation layer thicknesses may accordingly be selected to implement a semiconductor device 12 of high reliability. Moreover, since the metal post 30, operating as the via, is provided on the semiconductor element 13, the connection reliability of the interconnect A(17) and the electrode terminal 14 may be improved to enhance the secondary packaging reliability.

[Exemplary Embodiment 8]

FIGS. 17 and 18 depict schematic cross-sectional views for illustrating the manufacturing method for a semiconductor device according to an exemplary embodiment 8 of the present invention. (d) to (e) of FIG. 18 show process steps carried out following the process steps of (a) to (e) of FIG. 17. With the manufacturing method of the present exemplary embodiment, it is possible to manufacture the semiconductor device of the exemplary embodiment 4 (FIG. 7).

Initially, a support 25 is provided, as shown in (a) of FIG. 17. The support 25 may be formed of resin, metal, glass or silicon, either singly or in combination. A position mark may preferably be mounted on the support 25 for ease in mounting the semiconductor element 13. It is sufficient that the position mark may be recognized accurately to fulfill the role as position indicia. It may be provided by precipitating metal on the support 25 or by forming a recess by wet etching or by machining processing. In the present exemplary embodiment, the support 25 is a copper plate 0.5 mm in thickness, whilst the position mark is formed by depositing nickel to a thickness of 5 μm by electroplating on the support 25. The site of the support 25 where the semiconductor element 13 is mounted may be in the form of a recess or in the form of a slit. In this case, there is no necessity to supply the lateral surface of the semiconductor element 13 with an insulation material, so that it becomes possible to suppress the warping of the semiconductor device 12 otherwise produced due to the difference between the linear expansion coefficient of the insulation material and that of the support 25. In addition, the semiconductor device may be reduced in height.

The semiconductor element 13 is then mounted, on the support 25, carrying the position mark thereon, so that the electrode terminals 14 will form an upper surface, viz., assume a face-up state, as shown in (b) of FIG. 17. In the present exemplary embodiment, the semiconductor element 13 has narrow-pitch multi-pin configuration, with the pad pitch and the number of pins of the semiconductor element 13 enclosed being 20 to 150 μm and 1000 to 2000, respectively.

The insulation layer A (15) is then deposited so that the side carrying the electrode terminals 14 and the lateral surface of the semiconductor element 13 will be covered by the insulation layer simultaneously, as shown in (c) of FIG. 17. The insulation layer A (15) is formed by, for example, a photo-sensitive or a non-photo-sensitive organic material. The organic material used may be enumerated by, for example, an epoxy resin, an epoxy-acrylate resin, a urethane-acrylate resin, a polyester resin, a phenolic resin, a polyimide resin, BCB (benzocyclobutene), PBO (polybenzoxazole), and a polynorbornene resin. It is also possible to use, as the organic materials, glass cloths and woven or non-woven cloths formed by aramide fibers. These materials are impregnated with an epoxy resin, an epoxy-acrylate resin, a urethane-acrylate resin, a polyester resin, a phenolic resin, a polyimide resin, BCB (benzocyclobutene), PBO (polybenzoxazole) or a polynorbornene resin, and are used in this state.

In addition to the above organic materials, oxide-, hydroxide-, carbide-, carbonate-, nitride-, halogenide- or phosphate-based ceramics, such as silicon nitride, barium titanate, boron nitride, lead zirconate titanate, silicon carbide, steatite or zinc oxide, composite materials containing the above ceramics or glass as fillers, carbon nano-tubes, diamond-like carbon or Varilene, may also be used as the material for the insulation layers.

The depositing method may be enumerated by transfer molding, compression molding, printing, vacuum press, vacuum lamination, spin coating, die coating and curtain coating. In the present exemplary embodiment, an epoxy resin is deposited by vacuum lamination.

Then, to establish electrical connection between the electrode terminals 14 on the semiconductor element 13 and the external connection terminals, vias A (16) and interconnects A (17) are formed, as shown in (d) of FIG. 18. Initially, an opening, which later becomes the via A (16), is opened in an insulation layer A (15). If the insulation layer A (15) is of a photo-sensitive material, the opening is formed by photolithography. If the insulation layer A (15) is of a non-photo-sensitive material, or of a photo-sensitive material which is low in pattern resolution, the opening is formed by laser working, dry etching or a blast method. In the present exemplary embodiment, the laser working is used.

At least one metal, selected from the group consisting of copper, silver, gold, nickel, aluminum and palladium, or an alloy containing the metal(s) as main component, is charged into the opening to form the via A (16). For charging, an electroplating method, an electroless plating method, a printing method or a molten metal suction method may be used. Or, a post for current conduction may be formed in advance at a location which later becomes a via, an insulation layer may then be formed, and the surface of the insulation layer may then be removed by polishing to expose the post for current conduction to form the via.

The interconnect A (17) may be formed by a subtractive method, a semi-additive method or a full-additive method. In the subtractive method, a resist of a desired pattern is formed on a copper foil provided on a substrate. An unneeded portion of the copper foil is etched off and the resist is then peeled off to obtain a desired pattern. In the semi-additive method, a current supplying layer is formed by an electroless plating method, a sputtering method or a CVD (chemical vapor deposition) method, and a resist having openings in accordance with a desired pattern is then deposited. Then, a metal is precipitated by electroplating in the resist openings. The resist is then removed and the current supplying layer is etched off to obtain the desired interconnect pattern. In the full-additive method, a catalyst for electroless plating is adsorbed on a substrate, and a pattern is formed by a resist. As the resist is left over as a catalyst layer, the catalyst is activated, and metal is precipitated in the openings in the insulation layer by electroless plating to obtain a desired interconnect pattern. For the interconnect A (17), at least one metal selected from the group of copper, silver, gold, nickel, aluminum and palladium, or an alloy containing the metal(s) as main component, is used. In particular, copper is preferred in light of the value of the electrical resistance and cost.

The above mentioned steps of forming the insulation layers, interconnects and vias are repeated a number of times corresponding to the desired number of the layers. It is preferred that the cross-sectional shapes of the interconnects of the layers deposited, the cross-sectional shapes of the vias or the thicknesses of the insulation layers are increased progressively. It is also preferred that, in small diameter vias or layers in need of miniscule interconnects, a photo-via by ultraviolet light irradiation or a UV laser is used for forming a via and the semi-additive method is used for forming an interconnect. It is further preferred that, for a layer that may allow for forming a larger diameter via or an interconnect of relaxed line width or pitch, a $CO_2$ laser is used for forming a via and a subtractive method is used for forming an interconnect. The device or the method used or the insulation material is selected depending on variable cross-sectional shapes of the vias, on the interconnects or on the thicknesses of the insulation layers such as to improve the yield by the multilevel configuration as well as to lower the cost. In the present exemplary embodiment, the number of the layers is set to three, as shown in (e) of FIG. 18. However, this is not restrictive and the number of the layers may be any desired plural number larger than two provided that the layers are provided towards the side of the electrode terminals of the semiconductor element 13.

In the present exemplary embodiment, the UV laser method and the semi-additive method are used for forming the vias and the interconnects for the layer closest to the semiconductor element (first layer). For the second layer and further layers, a $CO_2$ laser and the subtractive method are used. As regards the first layer via diameter, the top via diameter was 25 μm, the bottom via diameter was 15 μm, with the L/S being 10 μm/10 μm. As regards the second and further via diameters, the top via diameter was 80 μm, the bottom via diameter was 70 μm, with the L/S being 50 μm/50 μm. The insulation layer thickness was 20 μm and 50 μm for the first layer and for the second and further layers, respectively.

A pattern of the solder resist 24 is then formed on the interconnect C (23) of the upper most layer. The solder resist 24 is formed for protecting the surface circuitry and assuring the combustion retardant performance of the semiconductor device 12. The solder resist may be formed of an organic material, such as epoxy-, acryl-, urethane- or polyimide-based material, which may be admixed with a filler of an inorganic or organic material as appropriate. The solder resist 24 does not have to be provided for the semiconductor device 12. The surface of the interconnect C (23), opened for the solder resist, may be formed of at least one metal selected from the group consisting of gold, silver, copper, tin and the solder material, and an alloy of the metal(s). In the present exemplary embodiment, nickel and gold were formed on the surface of the interconnect C (23) to thicknesses of 3 μm and 0.5 μm, respectively.

In the present exemplary embodiment, a multilevel semiconductor device 12, having enclosed therein a number of narrow-pitch multi-pin semiconductor elements, may be manufactured efficiently. Also, in the semiconductor device 12, the larger the number of the layers, the larger become the cross-sectional shapes of the vias and the interconnects, and the thicker become the insulation layers. The semiconductor device of a higher yield and higher reliability may be manufactured by selecting corresponding proper devices and processes as well as corresponding proper insulation materials. In addition, since the support 25 is provided in the semiconductor device 12, the structure suffers less warping and the second-order packaging reliability of the semiconductor device 12 may be improved to lower the cost.

Although the description has been made of preferred exemplary embodiments of the present invention, such exemplary embodiments are given only by way of illustration and are not intended to limit the scope of the present invention. It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modification aforementioned.

EXPLANATION OF SYMBOLS

12 semiconductor device
13, 13A semiconductor elements
14 electrode terminal
15 insulation layer A
16 via A
17 interconnect A
18, 18A insulation layers B
19, 19A vias B
20, 20A interconnects B
21, 21A insulation layers C
22, 22A vias C
23, 23A, 23B interconnects C (external connection terminals)
24 solder resist
25 support
26 adhesive layer
27 reinforcement
28 heat sink
29 insulation layer D
30 metal post (via)
31 coreless interconnect substrate (circuit substrate)
111 insulation layer
112 interconnect circuit layer
113 via conductor
117 terminal pad
119 interconnect substrate
121 electronic component enclosing multilevel substrate
124 cavity
125 electronic component
127 pad
128 passivation layer
129 transition layer
131 via-hole
133 conductor circuit (interconnect layer)

The invention claimed is:
1. A semiconductor device comprising:
at least a semiconductor element comprising electrode terminals on a surface thereof; and
a coreless substrate including enclosed therein said semiconductor element; said coreless substrate including a plurality of stacked interconnect layers and a plurality of stacked insulation layers, interconnects formed in said interconnect layers, vias formed in each one of said insulation layers and that electrically interconnect said interconnects above and below each of said insulation layers, and external connection terminals on a surface thereof;
wherein said semiconductor element is embedded in one of said insulation layers;
each of said external connection terminals and each of said electrode terminals are electrically interconnected via at least one of said interconnects or said via;
said insulation layers and said interconnect layers are stacked on one side of said semiconductor element; and
at least one of said vias has a cross-sectional shape different from that of the via provided in another one of said insulation layers or at least one of said interconnects has a cross-sectional shape different from that of the interconnect provided in another one of said insulation layers.
2. The semiconductor device according to claim 1, wherein out of said vias, the via of the layer closest to said electrode terminals is smallest in cross-sectional area.

3. The semiconductor device according to claim 1, wherein the cross-sectional area of said vias is increased stepwise from the layer closest to said electrode terminals towards the layer of said external connection terminals.

4. The semiconductor device according to claim 3, wherein the cross-sectional shapes of said vias are increased from the layer closest to said electrode terminals towards the layer of said external connection terminals layer by layer as substantially similar cross-sectional shapes are maintained.

5. The semiconductor device according to claim 1, wherein out of said interconnects, the interconnect of the layer closest to said electrode terminals is smallest in cross-sectional area.

6. The semiconductor device according to claim 1, wherein the cross-sectional shapes of said interconnects are increased stepwise from a layer closest to said electrode terminals towards the layer of said external connection terminals on the surface of said semiconductor device.

7. The semiconductor device according to claim 1, wherein a pitch of said electrode terminals is narrower than that of said external connection terminals.

8. The semiconductor device according to claim 1, wherein said vias increase in diameter towards said external connection terminals and decrease in diameter towards said electrode terminals.

9. The semiconductor device according to claim 1, wherein, among said insulation layers, there is such an insulation layer with an insulation material that is different from that of the other insulation layers.

10. The semiconductor device according to claim 1, wherein, an insulation layer from among said insulation layers that seals the surface of said electrode terminals of said semiconductor element differs from an insulation layer from among said insulation layers that seals the lateral surface of said semiconductor element.

11. The semiconductor device according to claim 1, wherein, a modulus of elasticity of said insulation layers is increases from an insulation layer closest to said electrode terminals from among said insulation layers an insulation layer of the external connection terminals from among said insulation layers.

12. The semiconductor device according to claim 1, wherein, a pitch of said electrode terminals is not less than 5 µto not more than 200 µm.

13. The semiconductor device according to claim 1, wherein,
there is provided metal posts on said electrode terminals of said semiconductor element; each of said metal posts being designed to operate as said via.

14. The semiconductor device according to claim 1, wherein, a support is provided on a surface of said semiconductor element opposite to the surface provided with said electrode terminals.

15. The semiconductor device according to claim 14, wherein,
a recess is formed in said support; said semiconductor element being provided in said recess.

16. The semiconductor device according to claim 1, wherein, a heat sink is provided on a surface of said semiconductor element opposite to the surface provided with said electrode terminals.

17. A method of manufacturing a semiconductor device comprising:
placing a semiconductor element on a support with a surface of said semiconductor element provided with an electrode terminal facing towards a front side;
forming a first interconnect structure; said first interconnect structure comprising an insulation layer that covers said semiconductor element, an interconnect layer provided on said insulation layer, and a via bored through said insulation layer to interconnect said electrode terminal and said interconnect layer;
forming a second interconnect structure on said first interconnect structure; said second interconnect structure comprising an insulation layer, a via and an interconnect layer on said first interconnect structure; wherein
said forming said second interconnect structure is repeated at least once; and
at least once of said forming said second interconnect structure comprises newly forming an interconnect or a via having a cross-sectional shape different from the cross-sectional shape of the via or the interconnect of the interconnect layer formed previously.

18. The method of manufacturing a semiconductor device according to claim 17, wherein the at least once of said forming said second interconnect structure comprises newly forming a via having a cross-sectional shape larger than that of the via formed previously.

19. The method of manufacturing a semiconductor device according to claim 17, wherein the at least once of said forming said second interconnect structure comprises newly forming an interconnect having a cross-sectional shape larger than that of the interconnect formed previously.

20. The method of manufacturing a semiconductor device according to claim 17, further comprising:
removing said support after forming said interconnect structure.

21. The method of manufacturing a semiconductor device according to claim 20, further comprising:
forming a heat sink after removal of said support.

22. The method of manufacturing a semiconductor device according to claim 17, wherein said forming said first interconnect structure comprises:
forming a first insulation layer on a lateral surface of said semiconductor element; and
forming a second insulation layer different in material type from said first insulation layer on a surface of said first insulation layer and on a surface of said semiconductor element.

23. The method of manufacturing a semiconductor device according to claim 17, wherein said semiconductor element includes a metal post provided on the surface of said electrode terminal, said metal post operating as via; wherein said forming said first interconnect structure comprises:
forming an insulation layer that covers said semiconductor element;
removing part of said insulation layer to expose the surface of said metal post; and
forming an interconnect layer on a surfaces of said metal post exposed and on a surface of said insulation layer.

* * * * *

UNITED STATES PATENT AND TRADEMARK OFFICE
CERTIFICATE OF CORRECTION

| | | |
|---|---|---|
| PATENT NO. | : 8,304,915 B2 | Page 1 of 1 |
| APPLICATION NO. | : 13/055372 | |
| DATED | : November 6, 2012 | |
| INVENTOR(S) | : Mori | |

It is certified that error appears in the above-identified patent and that said Letters Patent is hereby corrected as shown below:

In the Specification

Column 1, Line 10: Delete "arc" and insert -- are --

Column 1, Line 19: Delete "clement" and insert -- element --

Column 1, Line 22: Delete ".stacked" and insert -- stacked --

Column 1, Line 27: Delete "fell" and insert -- felt --

Column 1, Line 34: Delete "arc" and insert -- are --

Column 8, Line 4: Delete "provided" insert -- 30 provided --

Column 22, Line 42: Delete "otherwise" and insert -- 12 otherwise --

In the Claims

Column 35, Line 38: Claim 11, delete "layers" and insert -- layers towards --

Column 35, Line 42: Claim 12, delete "5 μto" and insert -- 5 μm to --

Signed and Sealed this
Twenty-first Day of October, 2014

Michelle K. Lee
*Deputy Director of the United States Patent and Trademark Office*